United States Patent [19]
Yamazaki et al.

[11] Patent Number: 5,474,945
[45] Date of Patent: Dec. 12, 1995

[54] METHOD FOR FORMING SEMICONDUCTOR DEVICE COMPRISING METAL OXIDE

[75] Inventors: Shunpei Yamazaki, Tokyo; Akira Mase, Aichi; Toshiji Hamatani, Kanagawa, all of Japan

[73] Assignee: Semiconductor Energy Laboratory Co., Ltd., Kanagawa, Japan

[21] Appl. No.: 147,580

[22] Filed: Nov. 5, 1993

Related U.S. Application Data

[62] Division of Ser. No. 846,164, Mar. 5, 1992, Pat. No. 5,289,030.

[30] Foreign Application Priority Data

Mar. 6, 1991 [JP] Japan .................................. 3-65418
May 11, 1991 [JP] Japan .................................. 3-135569

[51] Int. Cl.$^6$ .................................................. H01L 21/336
[52] U.S. Cl. .................. 437/41; 437/43; 437/197; 437/228; 437/237
[58] Field of Search .......................... 437/41, 43, 197, 437/160, 101, 228, 236, 237

[56] References Cited

U.S. PATENT DOCUMENTS

| | | |
|---|---|---|
| 4,455,737 | 6/1984 | Godejahn, Jr. . |
| 4,468,855 | 9/1984 | Sasaki .................................... 257/368 |
| 4,557,036 | 12/1985 | Kyuragi et al. . |
| 4,646,426 | 3/1987 | Sasaki . |
| 4,746,628 | 5/1988 | Takafuji et al. ........................ 437/160 |
| 4,769,338 | 9/1988 | Ovshinsky et al. ..................... 437/39 |
| 4,868,137 | 9/1989 | Kubota .................................... 437/41 |
| 4,900,695 | 2/1990 | Takahashi et al. ..................... 437/195 |
| 4,905,066 | 2/1990 | Kohjo et al. ............................ 257/412 |
| 5,097,311 | 3/1992 | Iwase et al. ............................ 257/412 |

FOREIGN PATENT DOCUMENTS

| | | | |
|---|---|---|---|
| 58-32466 | 2/1983 | Japan .................................. 437/187 |
| 58-81972 | 5/1983 | Japan .................................. 257/66 |
| 58-124273 | 7/1983 | Japan .................................. 257/66 |
| 58-115864 | 7/1983 | Japan .................................. 257/66 |
| 58-158967 | 9/1983 | Japan .................................. 257/66 |
| 59-214262 | 12/1984 | Japan .................................. 437/197 |
| 62-124769 | 6/1987 | Japan .................................. 257/59 |

OTHER PUBLICATIONS

Wolf et al., Silicon Processing, Lattice Press, vol. 1, 1986, pp. 151–154.
Wolf, Silicon Processing, Lattice Press, 1990, vol. 2, pp. 66–72.

*Primary Examiner*—T. N. Quach
*Attorney, Agent, or Firm*—Sixbey, Friedman, Leedom & Ferguson; Gerald J. Ferguson, Jr.; Eric J. Robinson

[57] ABSTRACT

An insulated gate field effect semiconductor device comprising a substrate having provided thereon a thin-film structured insulated gate field effect semiconductor device, said device being characterized by that it comprises a metal gate electrode and at least the side thereof is coated with an oxide of the metal. The insulated gate field effect semiconductor device according to the present invention is also characterized by that the contact holes for the extracting contacts of the source and drain regions are provided at about the same position of the end face of the anodically oxidized film established at the side of the gate. Furthermore, the present invention provides a method for forming insulated gate field effect semiconductor devices using less masks.

15 Claims, 18 Drawing Sheets

FIG. 14(A)
FIG. 14(B)
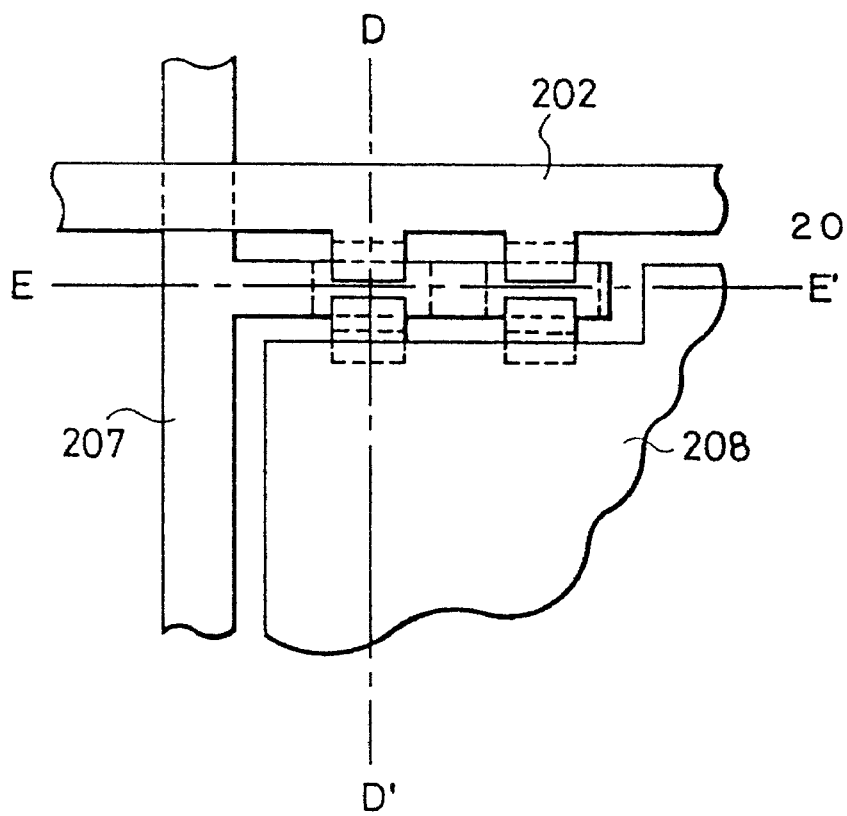
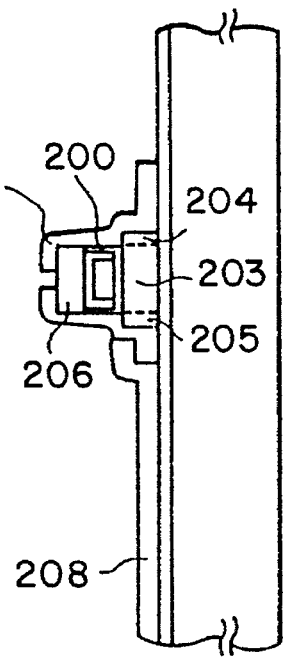
FIG. 14(C)
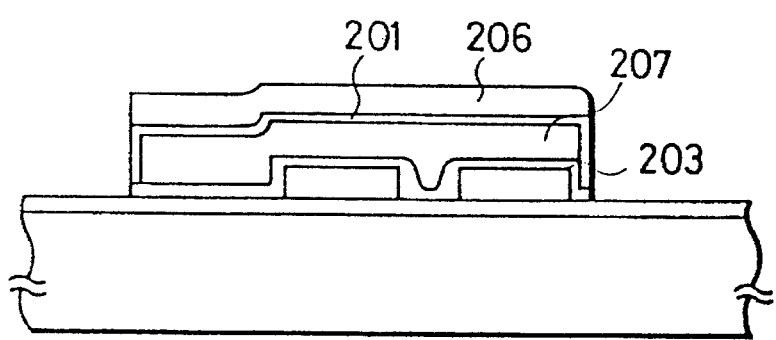

METHOD FOR FORMING SEMICONDUCTOR DEVICE COMPRISING METAL OXIDE

This is a Divisional application of Ser. No. 07/846,164, filed Mar. 5, 1992.

BACKGROUND OF THE INVENTION

1. Field of the Invention

The present invention relates to a semiconductor device and a method for forming the same. More particularly, the present invention relates to a thin film transistor applicable to liquid crystal electro-optical devices, contact type image sensors, and the like.

2. Description of the Prior Art

Insulated gate field effect semiconductor devices known to the present have been widely applied to various fields. Such semiconductor devices comprise a silicon substrate having integrated thereon a plurality of semiconductor elements so that the devices may function as integrated circuits (ICs) and large scale integrated circuits (LSIs).

In addition to the insulated gate field effect semiconductor devices of the type mentioned above, there is another type of such insulated gate field effect semiconductor devices which comprises a thin film semiconductor formed on an insulator substrate, rather than a silicon substrate. Those thin film insulated gate field effect semiconductor devices (referred to hereinafter as TFTs) are now more positively used, for example, in liquid crystal electro-optical devices as switching elements of pixels and driver circuits, and in read-out circuits of contact type image sensors and the like.

Those TFTs are produced, as mentioned above, by laminating thin films on an insulator substrate by a vapor phase process. This process can be conducted in an atmosphere controlled to a temperature as low as about 500° C., or even lower. Moreover, low cost substrates such those made of soda-lime glass and borosilicate glass can be utilized in those TFTs. Thus, the insulated gate field effect semiconductor device of the latter type are advantageous in that they can be fabricated using low cost substrates, and that they can be readily scaled up by depositing the thin films on a substrate having a larger area with the only limiting factor being the dimension of the apparatus in which the thin films are vapor-phase deposited. Accordingly, application of such insulated gate field effect semiconductor devices to liquid crystal electro-optical devices having a large pixel matrix structure or to a one- or two-dimensional image sensors has been expected, and, in fact, a part of such expectations has been met already.

A representative structure for the latter type of TFTs is shown schematically in FIGS. 2 and 6.

Referring to FIG. 2, a typical structure of a conventionally known TFT is explained. In FIG. 2, a thin film semiconductor 2 made of an amorphous semiconductor is deposited on a glass insulator substrate 1, and the thin film 2 comprises on the surface thereof a source area and a drain area 3, source and drain contacts 7, and a gate 11.

Those types of TFTs comprise, as mentioned above, semiconductor layers having deposited by a vapor deposition process. Since the electron and hole mobilities of the semiconductor layers in those TFTs are significantly low as compared with those of the conventional ICs and LSIs, it has been customary to subject the semiconductor layer 2 to a heat treatment for the crystallization thereof.

In a conventional TFT as shown in FIG. 2, the gate 11 is covered with a relatively thick interlayer insulator film 4 such as a silicon nitride film and a silicon oxide film, and to this interlayer insulator film are provided contact holes by a photolithographic process. The source and drain contacts 7 are electrically connected with source and drain areas 3. If feeding points to the source and the drain were to be provided at such positions, the distance L between each of the feeding points and the channel end becomes considerably long.

As mentioned earlier, the TFTs fabricated by a thin film deposition process at low temperatures are significantly low in the carrier mobility. Even upon doping an impurity, the still low conductivity produces a resistance within this distance L. Accordingly, the conventional TFTs suffer poor frequency characteristics and increase in ON circuit resistance. Furthermore, the area necessary for a TFT increases inevitably with increasing length of L. This made it difficult to accommodate a predetermined number of TFTs within a substrate of a limited dimension.

In FIG. 6, a thin film semiconductor 102 composed of an amorphous semiconductor is deposited on a glass insulator substrate 101, and the thin film 102 comprises on the surface thereof a source and a drain area 103, source and drain electrodes 107, and a gate 111.

The TFTs of this type in general are produced by first depositing a semiconductor film on the substrate, and, by patterning, forming island-like semiconductor areas 102 on the desired parts using a first mask. Then, an insulating film and further thereon a gate material are formed, from which a gate electrode 111 and a gate insulating film 106 are obtained by patterning using a second mask. A source and a drain area 103 are established on the semiconductor areas 102 in a self-aligned manner, using the gate electrode 111 and a photoresist formed using a third mask as masks. An interlayer insulator film 104 is formed thereafter. To this interlayer insulator film are provided contact holes using a fourth mask, so that the contacts may be connected to the source and the drain through those contact holes. A contact material is provided to the resulting structure thereafter, which is patterned to form contacts 107 using a fifth mask. Thus is obtained a complete TFT.

As can be seen from the foregoing description, a TFT in general requires five masks to complete a structure, and in a complementary TFT, six masks are necessary. Naturally, a more complicated IC should incorporate further more masks. The use of increased number of masks involves a complicated process for fabricating a TFT element, which accompanies frequent mask alignment steps. Such a complicated process inevitably results in a lowered yield and productivity of the TFT elements. The demand for larger electronic devices using the TFT elements, for making the TFT elements themselves more compact, and for finer patterning, makes the yield and productivity even worse. Thus, it has been desired to develop a simpler process which involves no complicated steps, and a TFT based on a novel structure which requires less masks.

SUMMARY OF THE INVENTION

An object of the present invention is to provide a semiconductor device based on a novel structure.

Another object of the present invention is to provide an insulated gate field effect semiconductor device having each of the feeding points for source and drain in proximity to the channel region at a shorter distance to the channel ends.

Still another object of the present invention is to provide a method for forming semiconductor devices using less masks.

The insulated gate field effect semiconductor device according to the present invention is characterized by that the TFT comprises a metal gate electrode having at least to the side thereof a film of an anodically oxidized gate electrode material. The insulated gate field effect semiconductor device according to the present invention is also characterized by that the contact hole for the extracting contacts of the source and drain semiconductor regions are provided at about the same position of the end face of the anodically oxidized film established at the side of the gate electrode.

To improve the carrier mobility in the semiconductor layer of the insulated gate field effect semiconductor device according to the present invention, if necessary, the substrate having deposited thereon a silicon semiconductor film containing hydrogen therein may be subjected to thermal treatment to thereby modify said semiconductor film into such having a crystalline structure. Furthermore, to minimize the distance L between the feeding points and the channel ends, a metal gate electrode may be provided, e.g., an aluminum gate electrode, and the outer (peripheral portion) of this gate electrode may be oxidized then to form at least on the side thereof a metal oxide film, e.g., an aluminum oxide film.

Furthermore, the gate electrode together with the aluminum oxide film surrounding said gate electrode may be used as a mask to form contact holes for the extract contacts of the source and the drain with a side surface of the contact hole located substantially on a side surface of the aluminum oxide film in a self-aligned manner. The present invention provides, as is shown in the schematic cross sectional view of FIG. 1, a TFT comprising a metal gate electrode 8 having at least on the side thereof an oxide layer 10 comprising the metal, e.g. an aluminum oxide layer, to which source and drain electrodes 7 (contacts for a drain and a source) connected to the source and drain semiconductor regions respectively are provided approximately at the end of the oxide layer. The source and drain electrodes 7 are connected to the source and drain semiconductor regions 3. By taking such a construction, a shorter distance L between said feeding points and the channels has been achieved. In FIG. 1, a channel is located adjacent to the gate electrode 8 between the source and drain semiconductor regions 3 under a gate insulating film 6. In FIG. 1, the gate insulating film 6 is provided between the channel and the gate electrode 8. In FIG. 1, a side of at least one of the source and drain electrodes 7 is substantially aligned with a side of the oxide layer 10. In FIG. 1, the oxide layer is in contact with the gate electrode and at least one of the source and drain electrodes. In FIG. 1, a side of the source semiconductor region is aligned with a side of the oxide layer and also a side of the drain semiconductor region is aligned with a side of the oxide layer.

Ideally, it is favorable to reduce the distance L to zero from the viewpoint of lowering the resistance (in FIG. 1, indeed, the distance L is approximately zero). However, difficulties ascribed to process technology, for example, a small extension of the source and the drain semiconductor regions under the gate, hinder achievement of a complete zero. Nevertheless, a shorter distance L still promises a considerable effect in reducing the resistance.

In the embodiment exemplified by FIG. 1, the aluminum oxide film around the gate electrode is established over the side and the upper plane of the gate electrode, i.e., over the whole outer plane exposed to the outside. However, the aluminum oxide film according to the present invention not necessarily be provided to the whole outer surrounding. The aluminum oxide film should be provided at least to cover the side of the gate electrode to shorten the distance L. If the aluminum oxide film is provided to the whole outer as is shown in FIG. 1, this film can be used as it is as a part of a mask at the fabrication of the contact holes, because the aluminum oxide film is hardly etched. Furthermore, other wiring, e.g., a wiring for the source electrode, may be crossed over this aluminum oxide film to establish a three-dimensional wiring which facilitates the later process steps for integration.

In the insulated gate field effect semiconductor device according to the present invention, what is meant by providing the contact holes for the extract contacts of the source and the drain in an approximately the same position as that of the ends of the gate electrode and the aluminum oxide film, is a structure resulting upon formation of contact holes in a self-aligned manner using the ends of the gate electrode and the aluminum oxide film, as well as a structure having a slight positional deviation in the case of using masks at the positioning, ascribed to the incomplete alignment of the masks. Referring to FIG. 1, for example, the edge portion of the insulator film 9 is sometimes displaced from the end of the aluminum oxide at the mask alignment when the contact portion alone is intended to form. Such a case is included in the latter case mentioned hereinbefore. In the former case taking advantage of the aluminum oxide film as a mask, i.e., in the case of extending the etching area of the insulator film up to the gate, the insulator film 9 can be completely removed from the gate, and the end of the source or the drain is certainly aligned with that of the aluminum oxide film 10 to result in a shortened distance L.

The aluminum oxide may be provided around the gate electrode by anodically oxidizing said gate electrode. The anodic oxidation process comprises applying an electric current to a metal gate electrode having dipped in an acidic solution to oxidize the surface thereof by an electrochemical reaction. There may be used other processes, provided that the oxide film has a dense structure and that the oxidation can be effected rapidly.

The insulated gate field effect semiconductor device according to the present invention is also characterized by that it comprises a TFT gate electrode surrounded by an anodically oxidized film of the same material constituting the gate electrode, with the contacts (source and drain electrodes) connected to the source and the drain being brought into contact with the upper planes and the sides of the source and the drain each, and that said contacts (source and drain electrodes) being connected to each of the drain and the source extend on the upper surface of the oxidized film having provided surrounding said gate electrode.

As shown in the schematically shown cross sectional view of FIG. 5, the TFT according to the present invention comprises an anodically oxidized film 110 at least as the surroundings of the gate electrode 108 comprising a metal, with the upper planes and the sides of the source and drain semiconductor regions slightly sticking out from the ends of said anodically oxidized film. The source and drain semiconductor regions are connected to the contacts 107 (source and drain electrodes) through these slightly sticking out portions (that is, the upper planes and the sides of the source and drain semiconductor regions) to make the area of connection larger. Furthermore, the contacts 107 are extended over the upper portion of the anodically oxidized film 110, at which they are patterned into separate electrodes. In FIG. 5, a channel is located adjacent to the gate electrode 108 between the source and drain semiconductor regions 103 under a gate insulating film 106. In FIG. 5, the gate insulating film 106 is provided between the channel and the gate electrode 108. In FIG. 5, said anodically oxidized film 110 is provided between the gate electrode 108 and the source and drain electrodes 107.

Referring to FIG. 7, a fabrication process for the TFT according to an embodiment of the present invention and having the structure illustrated in FIG. 5 is explained. The FIG. 7 is provided as an explanatory means and the details concerning dimension and shape are a little different from those of the actual device.

First, as in FIG. 7 (A), on a glass substrate, e.g., a substrate of a heat-resistant crystallized glass 101, is deposited a semiconductor layer 102. The semiconductor layer, e.g., a silicon semiconductor layer, may be an amorphous semiconductor, a polycrystalline semiconductor, or any other selected from a wide variation, and may be deposited by processes such as a plasma-assisted CVD (chemical vapor deposition), sputtering, and pyrolytic CVD, depending on the type of the semiconductor used. In the following explanation, the process steps are described according to a case in which a polycrystalline silicon semiconductor is used. The next step in the fabrication process comprises forming a silicon oxide film 106 on the semiconductor layer 102, so that the silicon oxide film 108 may function as the gate insulating film. Further on the silicon oxide film is formed an contact material layer, an aluminum layer in this case, from which a gate electrode is established. The contact material layer is then patterned into the gate electrode 108 using a first mask ㉑. An anodically oxidized film is provided as a surrounding of the gate electrode 108, by conducting an anodic oxidation in an electrolyte for the anodic oxidation. A pore-free aluminum oxide 110 can be provided at least at the vicinity of the channel region to the surrounding of the gate electrode, as illustrated in FIG.7 (B).

The electrolyte to be used in the anodic oxidation includes, representatively, strong acid solutions of, such as sulfuric acid, nitric acid, and phosphoric acid, as well as mixed acid comprising tartaric acid or citric acid, having added therein ethylene glycol or propylene glycol or the like. The solution (electrolyte) may be further mixed with a salt or an alkaline solution to adjust the solution (electrolyte) for the pH value.

The anodic oxidation was performed as follows. The substrate was immersed into an AGW electrolyte having prepared by adding 9 parts of propylene glycol to 1 part of an aqueous 3% tartaric acid solution. A direct current (D.C.) was applied to the substrate by connecting the aluminum gate to the anode of a power source and using a platinum cathode as the counter electrode. The electric current was applied first at a constant current density of 3 mA/cm$^2$ for 220 minutes, and then at a constant voltage for 5 minutes, to thereby obtain a 1,500 Å thick aluminum oxide film around the gate electrode. The insulating properties of this aluminum oxide film was evaluated using a specimen having subjected to an oxidation treatment under the same condition as that employed above. As a result, a resistivity of $10^{15}$ Ω and a dielectric breakdown of $3\times10^6$ V/cm was obtained for the film. The surface of the sample was observed through a scanning electron microscope to find surface irregularities at a magnification of about 10,000, but no minute boles. The film was therefore evaluated as a favorable insulator coating.

On the surface of the thus obtained insulator film was further deposited a silicon oxide film 112 by plasma-assisted CVD. The film was then anisotropically etched along a direction nearly vertical to the substrate to leave over silicon oxide 113 on the side walls of the protrusion constructed by the gate electrode and the anodically oxidized film (see FIG. 7 (D)). The semiconductor layer 102 is then removed by etching in a self-aligned manner using the remaining silicon oxide film 113, and the gate electrode 108 and the anodically oxidized film 110 of the protrusion as a mask. The resulting structure is shown in FIG. 7 (E). The structure as viewed from the upper side is shown in FIG. 8(A). The cross sectional view taken along the line A—A' indicated in FIG. 8(A) is given in FIG. 7.

The structure as shown in FIG. 7(E) was subjected to a selective etching to remove only silicon oxide, i.e., the silicon oxide film 113 and the gate insulating film, using the gate electrode 108 and the anodically oxidized film 110 thereof as the mask, to thereby obtain a structure having a part of the semiconductor layer 102 exposed to outside at the edge of the gate, as shown in FIG. 7(F) and FIG. 8(B).

The resulting semiconductor portion exposed to the air is then doped with impurities to establish a source and a drain. As can be seen in FIG. 7(F), the part exposed to the air was bombarded with phosphorus ions from the upper side of the substrate using the anodically oxidized film 110 of the gate electrode as the mask. Thus are formed the source and drain regions 103. In FIG. 7(F), sides of the source and drain regions 103 are located at sides of the semiconductor portion exposed to the air. For the activation of the regions, a laser beam is irradiated to the exposed portions. Instead of carrying out the laser annealing as the activation treatment of the source and the drain regions, they can be otherwise activated by thermal annealing and the like.

An aluminum layer is then formed on the upper surface of the resulting structure, which is separated into source and drain electrodes by etching the aluminum layer into a predetermined pattern using a second mask ㉒. The structure obtained in this step is shown in FIG. 8(C). This structure is then finished into a TFT shown in FIGS. 7(G) and 8(D), by removing the unnecessary portions of the semiconductor layer 102 using the source and the drain electrodes 107 and the anodically oxidized film 110 on the gate electrode as the mask.

It can be seen from the foregoing description that the present invention provides a TFT by involving merely 2 masks.

In the case of a complementary TFT, 1 or 2 more masks suffice the fabrication of the structure.

The TFT thus obtained can be connected to the outer through a non-oxidized part of the gate electrode left out at the anodic oxidation, by carrying out the anodic oxidation treatment with care not to contact the part of the gate electrode with the electrolyte used at the anodic oxidation, or through a non-oxidized part of the gate electrode produced by selectively etching the anodically oxidized film exposed to the outer at the final step of selective etching of the source and drain electrodes together with the accompanying anodically oxidized film, after etching the unnecessary semiconductor layer. Otherwise, a contact hole may be perforated in a specific anodically oxidized film, using a third mask.

The foregoing description for the fabrication of a TFT is merely an example, and it should be understood that the present invention is not limited thereto. For example, the source and the drain regions may be doped with impurities by ion-bombardment at the stage shown in FIG. 7(B) using the anodically oxidized film 110 of the gate electrode as the mask, instead of carrying out the doping step after the patterning of the semiconductor layer 102 as demonstrated above in FIG. 7(F).

Furthermore, after the semiconductor layer 102 is established and before forming a gate, another photomask can be incorporated to carry out patterning of the semiconductor layer at the proximity of the TFT area into an island-like structure. Thus can be obtained a structure as shown in FIG. 9, which comprises only the substrate or an insulator film established on the substrate under the lead wiring instead of the semiconductor layer 102. Such a configuration avoids establishment of a capacitor which may otherwise be formed by the gate wiring and a semiconductor layer. In this manner can a TFT of an increased response be fabricated by using only 3 masks. The structure as viewed from the upper side is given in FIG. 9(A), and the cross sectional view along the line B—B' is given in FIG. 9(B).

In a general structure for an insulated gate field effect semiconductor device according to the present invention as shown in FIG. 5, the end of the gate is displaced from the position of the end of the source or the drain region by the thickness of the insulator film (anodically oxidized film) provided around the gate. Such an offset structure decreases the carrier density at the channel and, at the same time, reduces the electric field intensity at the drain-channel junction that the drain breakdown voltage can be improved. Since the thickness of the insulator film may be varied in the range of, for example, from 10 to 50 nm by changing the condition at the oxidation, the amount of this offset can be readily set as desired, depending on the required device characteristics. Furthermore, a lightly doped drain (LDD) structure can be realized by controlling the impurity concentration of this offset portion to a value lower than that in the source and the drain regions.

In FIG. 5, a channel length (a distance between the source and the drain regions) is longer than a length of the gate electrode in a direction of the channel length.

An offset region to which no electric field or very weak electric field is applied by a gate voltage can be formed in a portion of a channel region in contact with a source or a drain region in an insulated gate field effect transistor in which a channel length thereof is longer than a length of a gate electrode thereof in a direction of the channel length. For example, in FIG. 5, no electric field is applied to the offset region located in the channel region in the semiconductor 102 between a portion of the channel region just under the gate electrode 108 and the source or the drain region, a very weak electric field is applied to the offset region as compared with an electric field applied to the portion of the channel region just under the gate electrode 108. In FIG. 5, for example, the channel length is longer than the length of the gate electrode 108 in the direction of the channel length by an approximately twofold thickness of the insulator film (anodically oxidized film).

BRIEF DESCRIPTION OF THE DRAWINGS

FIG. 14A–14C shows a schematically drawn diagram indicating the mounted arrangement on the substrate of a liquid crystal electro-optical device to which a complementary TFT according to another embodiment of the present invention is applied.

DESCRIPTION OF THE PREFERRED EMBODIMENT

Now the present invention is described in further detail below referring to some EXAMPLES, however, it should be noted that the present invention is not to be construed as being limited thereto.

EXAMPLE 1

Figure 4:
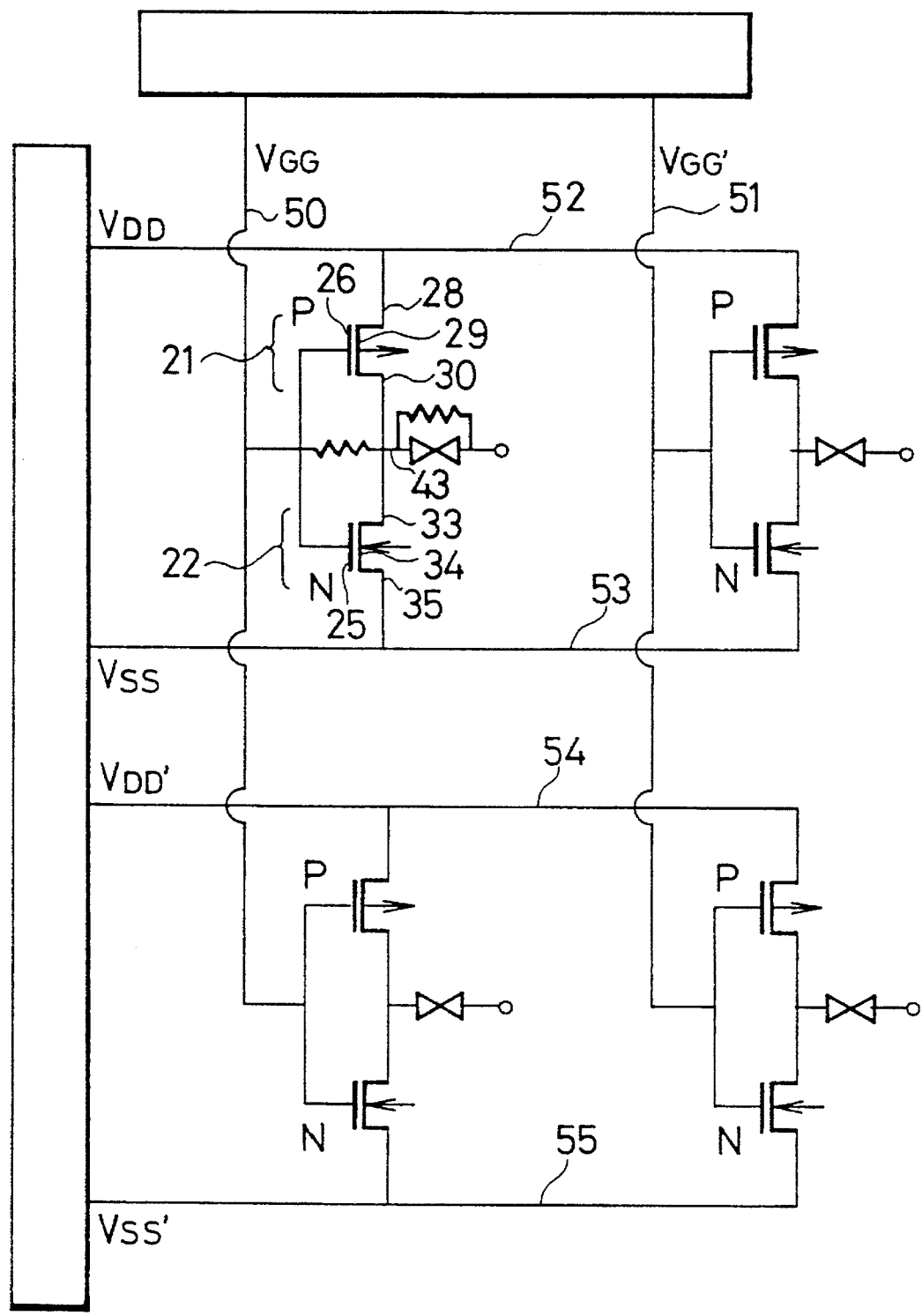
FIG. 4 shows a circuit diagram of a liquid crystal electro-optical device to which an insulated gate field effect semiconductor device according to an embodiment of the present invention is applied.
Figure 5:
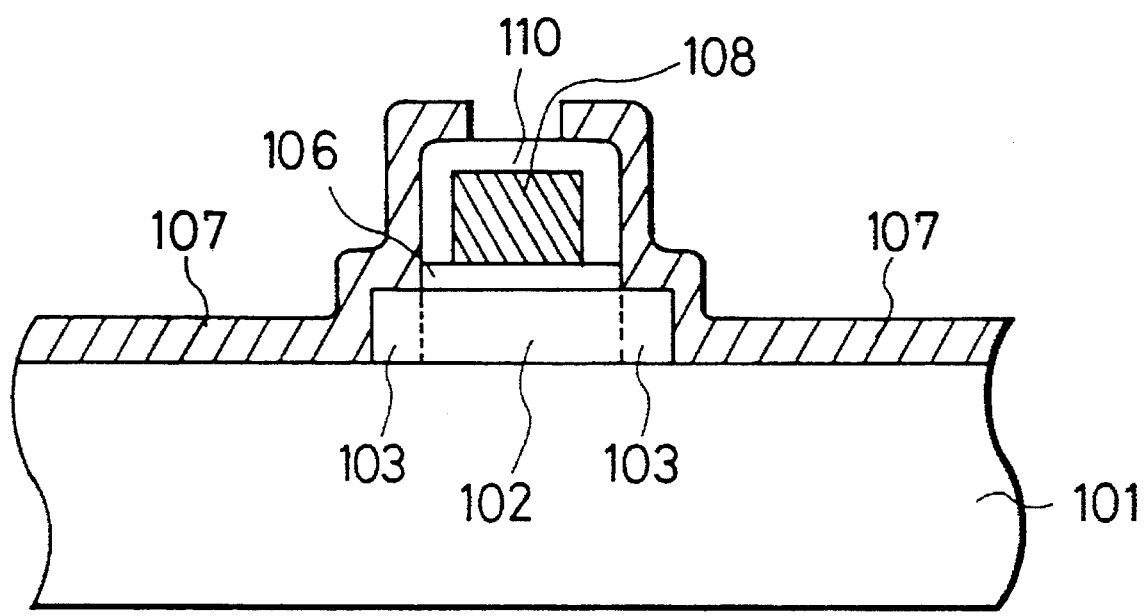
FIG. 5 shows the structure of a TFT according to an embodiment of the present invention.
Figure 6:
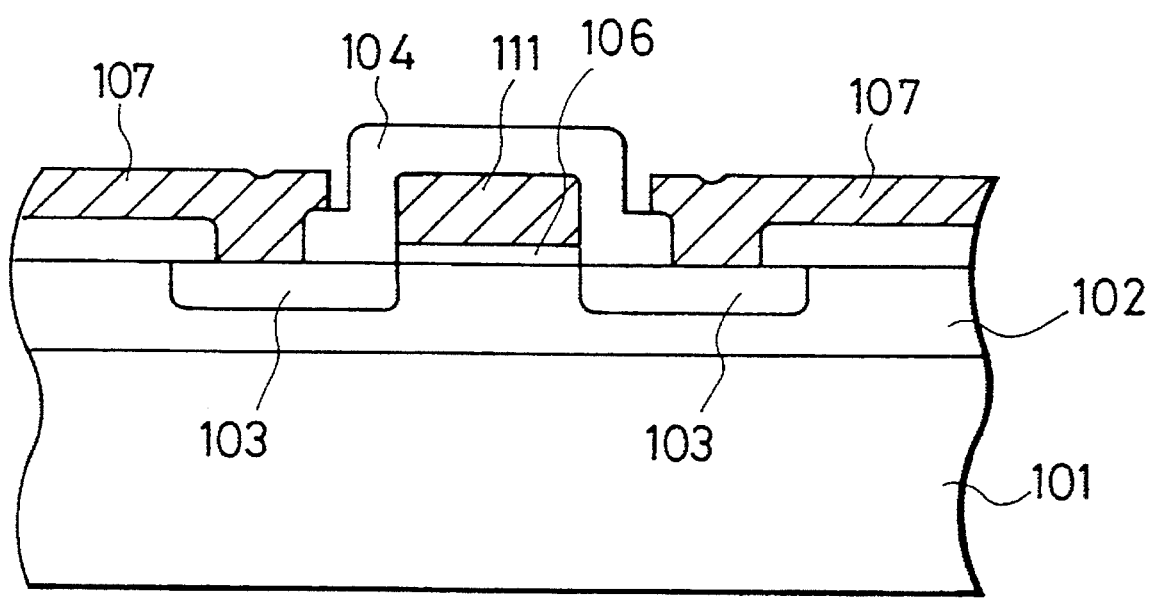
FIG. 6 shows the structure of a conventional TFT.
Figure 7A:
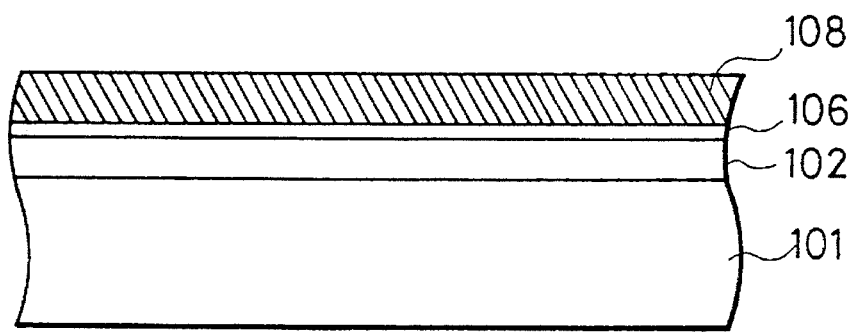
FIG. 7A–7G shows a schematically shown cross sectional view of a TFT according to the present invention to illustrate the fabrication step thereof.
Figure 7B:
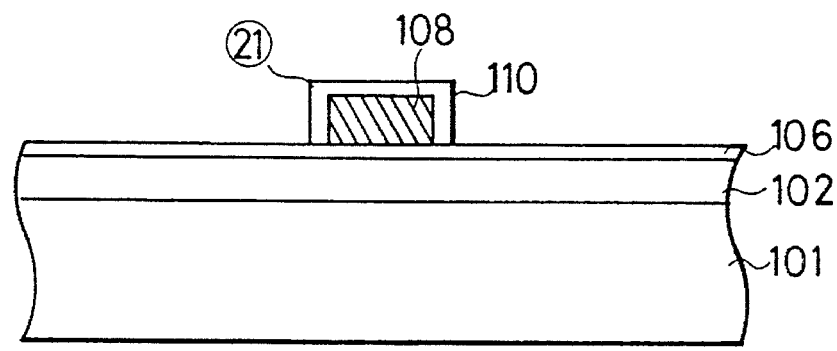
Figure 7C:
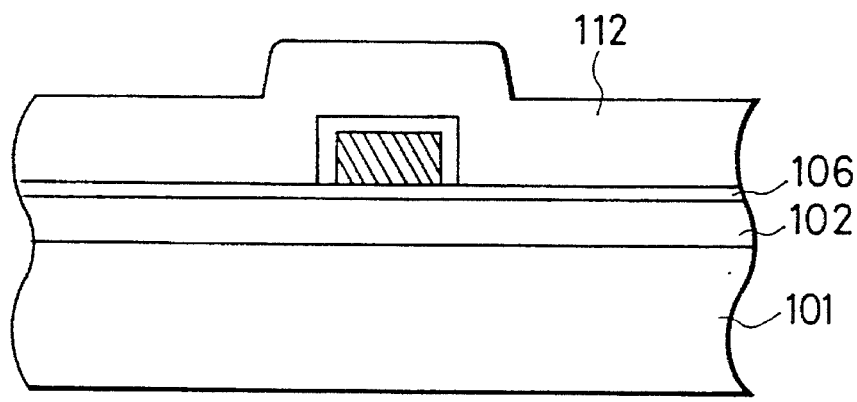
Figure 7D:
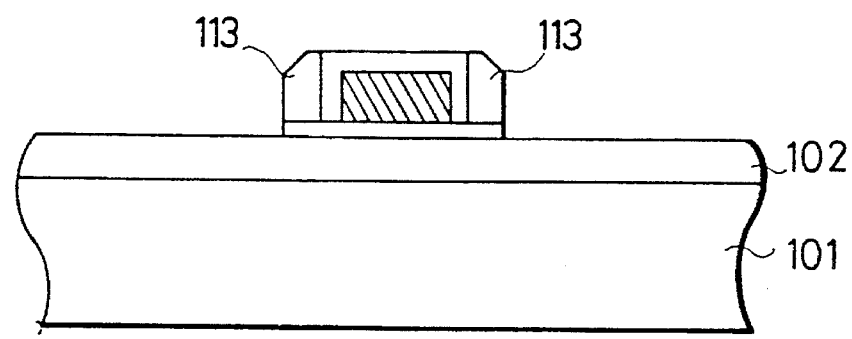
Figure 7E:
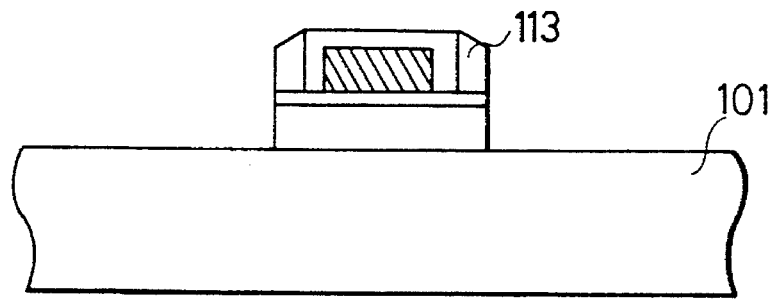
Figure 7F:
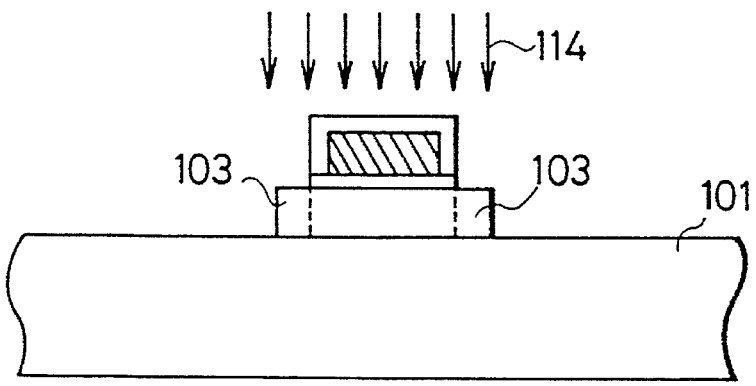
Figure 7G:
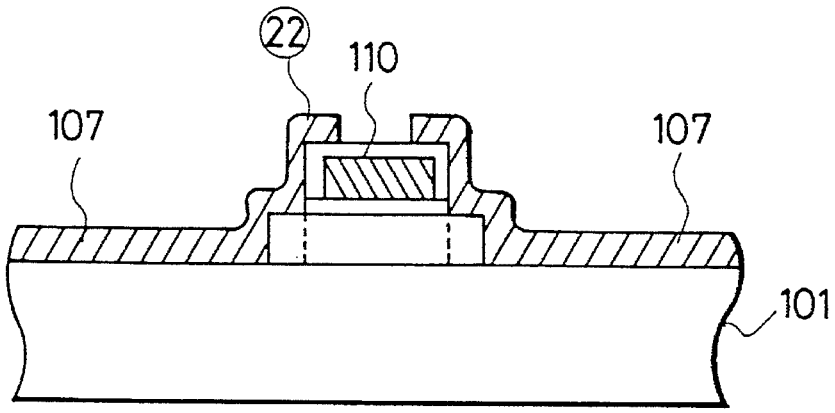
Figure 8A:
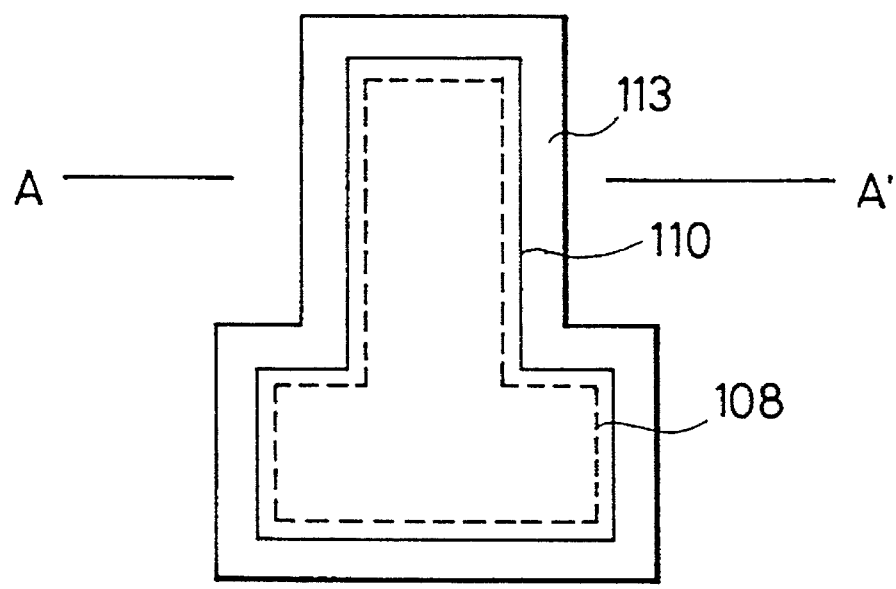
FIG. 8A–8D shows a schematically shown view seen from the upper side of a TFT according to the present invention to illustrate the fabrication step thereof.
Figure 8B:
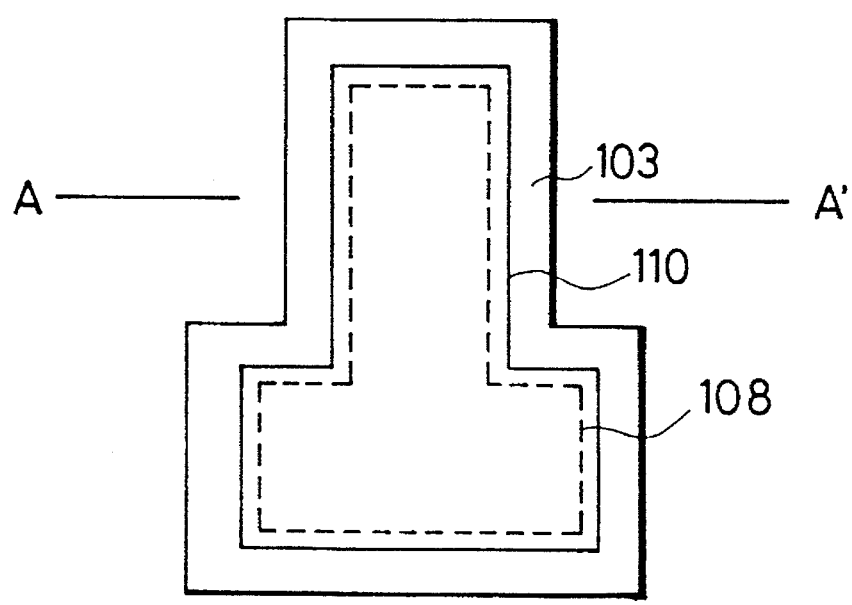
Figure 8C:
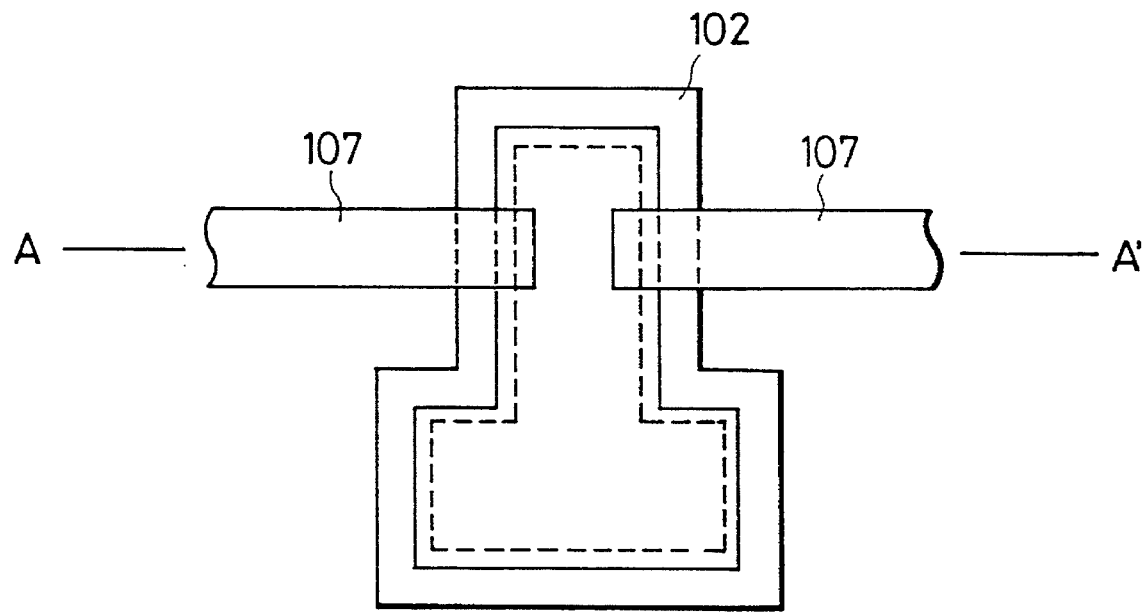
Figure 8D:
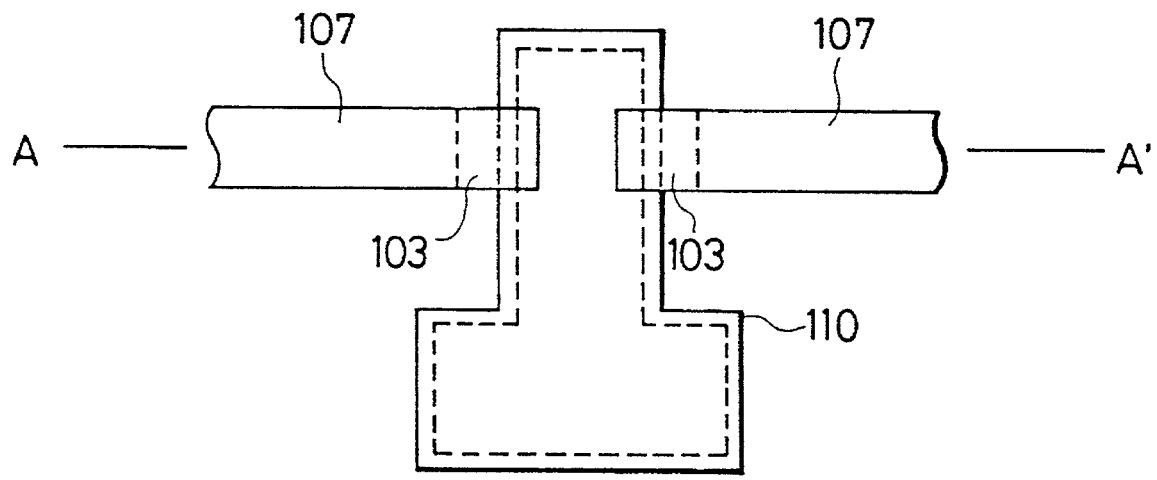
Figure 9A:
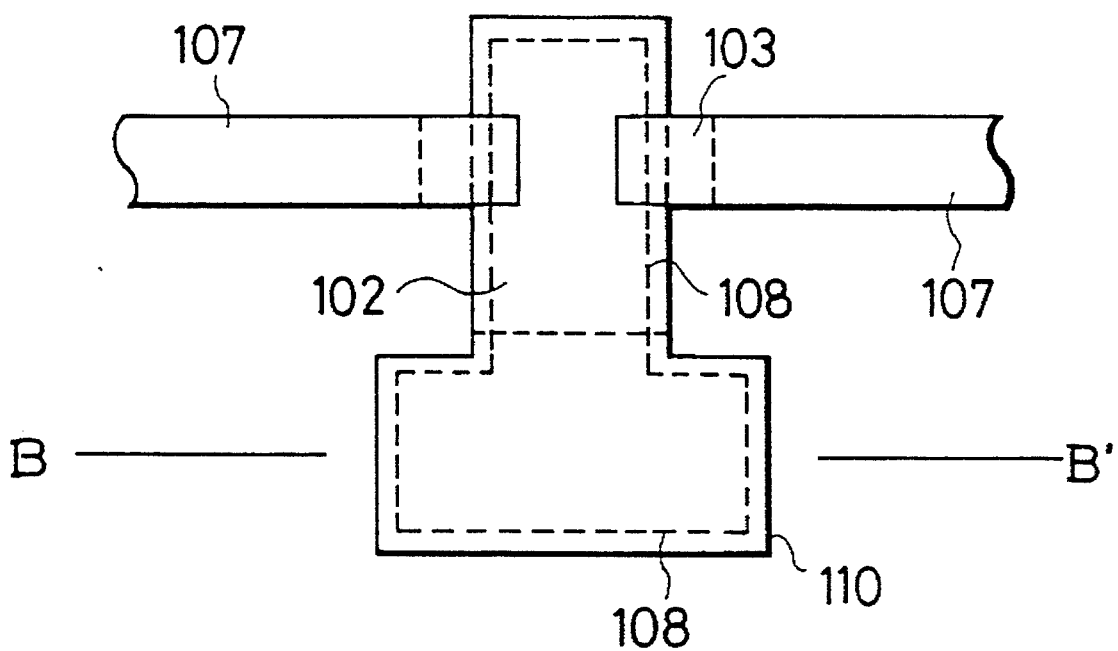
FIG. 9A–9B shows the structure of another TFT according to the present invention.
Figure 9B:
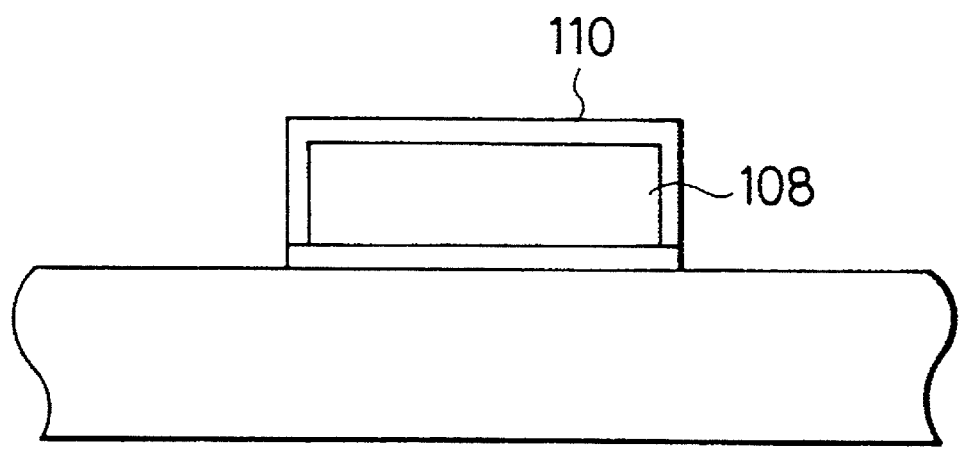

Referring to FIG. 4, an example in which a TFT according to the present invention is applied to a liquid crystal electro-optical device having a diagram as illustrated i FIG. 4 is described. In FIG. 4, an N-channel TFT (N-TFT) 22 and a P-channel TFT (P-TFT) 21 in a complementary configuration are provided to each of the pixels of the liquid crystal device. Each of the TFTs are connected to a common signal wire 50 through respective gate electrodes, and the output terminals of the N-TFT 22 and the P-TFT 21 are connected to the common pixel electrode 43, whereas each of the other output terminals 28 and 35 in the respective TFTs is connected to the other signal wires 52 and 53 to provide an inverter structure. The positions of the P-TFT and the N-TFT may be reversed to establish a buffer structure and provide the complementary TFTs to each of the pixel electrodes.

Referring to FIGS. 3(A) to 3(G), the fabrication process of a complementary TFT (C/TFT) on a substrate according to the present invention to be used in a liquid crystal electro-optical device is described below.

Figure 1:
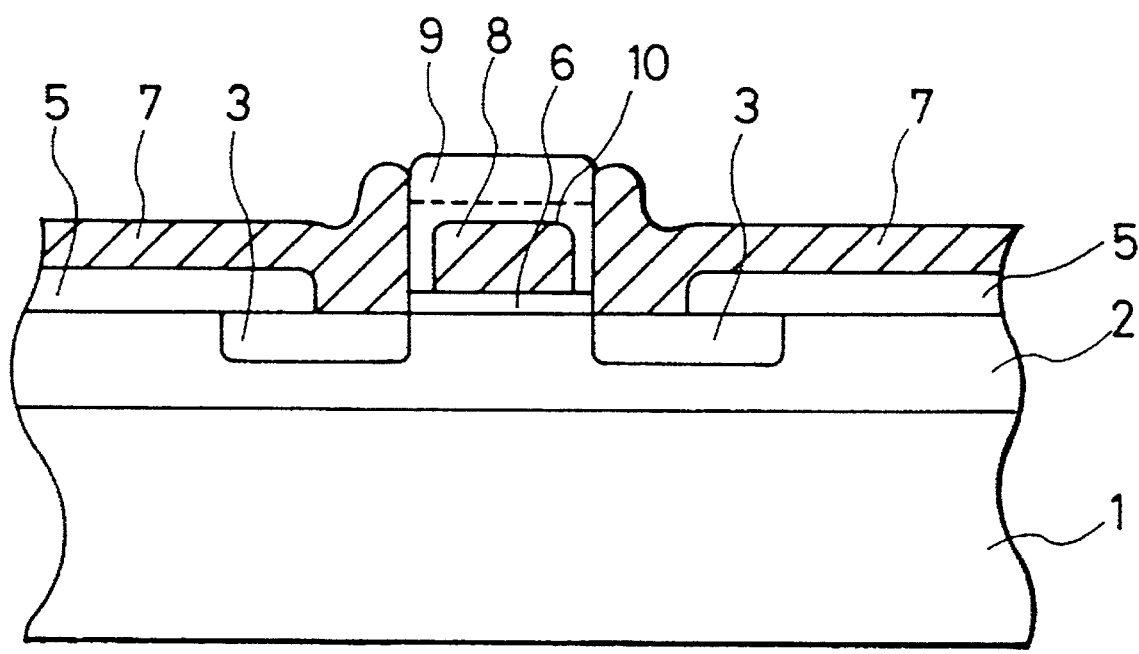
FIG. 1 shows a schematically drawn cross sectional view of an insulated gate field effect semiconductor device according to an embodiment of the present invention.
Figure 2:
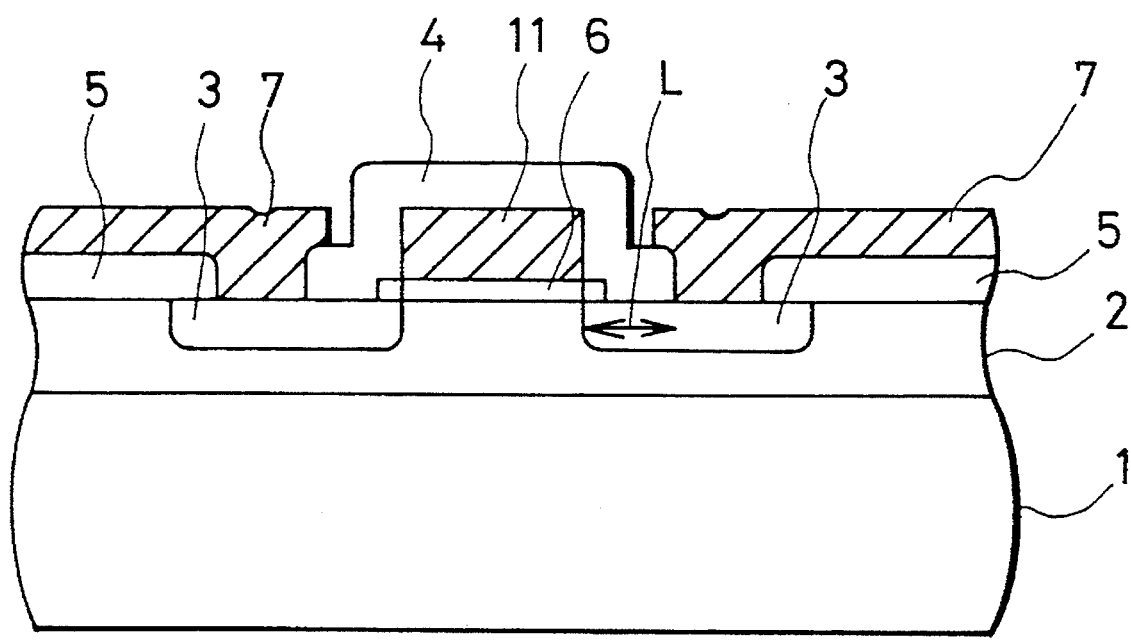
FIG. 2 shows a schematically drawn cross sectional view of a conventional insulated gate field effect semiconductor device.
Figure 3A:
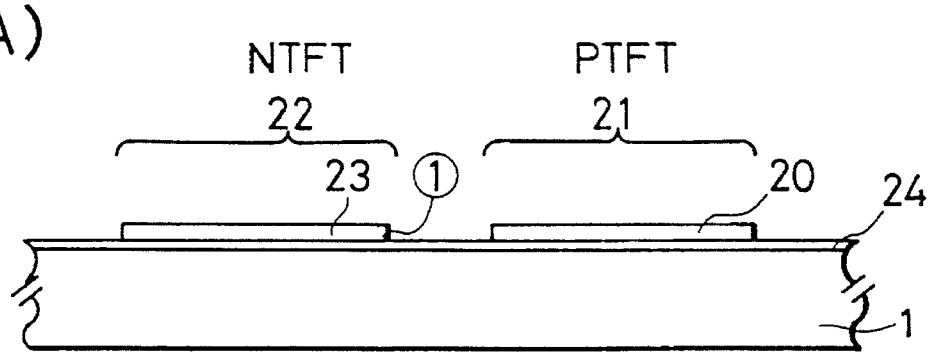
FIG. 3A–3G shows a fabrication process of an insulated gate field effect semiconductor device according to an embodiment of the present invention.

In FIG. 3(A), a silicon oxide film from 1000 to 3000 Å in thickness as a blocking layer 24 was deposited by radio-frequency (RF) magnetron sputtering on a non-expensive glass substrate which is resistant to a heat treatment at a temperature of 700° C. or lower, e.g. about 800° C. Examples of such glasses useful as the substrate include crystallized glass such as AN glass and neo-ceramic glass, and Vyco® 7913 (a heat resistant glass manufactured by Corning Corp.).

The silicon oxide film was deposited in a 100% oxygen atmosphere at the deposition temperature of 150° C., at an output of from 400 to 800 W and a pressure of 0.5 Pa. The target used was quartz or single crystal silicon, and thus was obtained the film at a film deposition rate of from 30 to 100 Å/minute.

An amorphous silicon film was deposited on the silicon oxide blocking layer by any of the processes of low pressure chemical vapor deposition (LPCVD), sputtering, and plasma-assisted CVD (PCVD).

In the LPCVD process, film deposition was conducted at a temperature lower than the crystallization temperature by 100° to 200° C., i.e., in the range of from 450° to 550° C., e.g., at 530° C., by supplying disilane ($Si_2H_6$) or trisilane ($Si_3H_8$) to the CVD apparatus. The pressure inside the reaction chamber was controlled to be maintained in the range of from 30 to 300 Pa. The film deposition rate was 50 to 250 Å/minute. Furthermore, optionally boron may be supplied as diborane during the film deposition to control the threshold voltage ($V_{th}$) of the N-TFT to be approximately the same as that of the P-TFT.

The film deposition process by sputtering was conducted using a single crystal silicon as the target in an argon atmosphere having added therein from 20 to 80% of hydrogen, e.g., in a mixed gas atmosphere containing 20% of argon and 80% of hydrogen. The back pressure prior to sputtering was controlled to $1\times10^{-5}$ Pa or lower. The film was deposited at a film deposition temperature of 150° C., a frequency of 13.56 MHz, a sputter output of from 400 to 800 W, and a pressure of 0.5 Pa.

In the deposition of a silicon film by a PCVD process, the temperature was maintained, e.g., at 300° C., and monosilane ($SiH_4$) or disilane ($Si_2H_6$) was used as the reacting gas. A high frequency electric power was applied at 13.56 MHz to the gas inside the PCVD apparatus to effect the film deposition.

The films thus obtained by any of the foregoing processes preferably contains oxygen at a concentration of $5\times10^{21}$ $cm^{-3}$ or lower, and more preferably, $7\times10^{20}$ $cm^{-3}$ or lower. If the oxygen concentration is too high, the film thus obtained would not crystallize. Accordingly, there would be required to elevate the thermal annealing temperature or to take a longer time for the thermal annealing. Too low an oxygen concentration, on the other hand, increases an off-state leak current due to a backlighting when the semiconductor layer is irradiated with a light beam in a liquid crystal electro-optical device. Accordingly, the oxygen concentration was set in the range of from $4\times10^{19}$ to $4\times10^{21}$ $cm^{-3}$ to readily crystallize the semiconductor layer by thermal annealing at a moderate temperature (600° C. or lower). The hydrogen concentration was $4\times10^{20}$ $cm^{-3}$, which accounts for 1% by atomic with respect to the silicon concentration of $4\times10^{22}$ $cm^{-1}$.

Oxygen concentration was controlled to $7\times10^{20}$ $cm^{-3}$ or lower, preferably $7\times10^{19}$ $cm^{-3}$ or lower, and more preferably $1\times10^{19}$ $cm^{-3}$ or lower to enhance crystallization of the source and drain regions, while selectively adding oxygen, carbon, or nitrogen by ion-implantation to a part of the channel forming regions of the TFT which constitute the pixel, to such an amount to give a concentration in the range of from $5\times10^{19}$ to $5\times10^{21}$ $cm^{-3}$ preferably $5\times10^{20}$ to $5\times10^{21}$ $cm^{-3}$ to reduce the sensitivity to light. In a TFT fabricated in this manner, particularly in the TFT which constitutes the peripheral circuits, the oxygen concentration was lowered while a higher carrier mobility was imparted. This facilitated high frequency operation while the leak current of the TFTs at the OFF state in the pixel peripheral switching elements is reduced.

Thus was deposited an amorphous silicon film at a thickness of from 500 to 5,000 Å, e.g., at a thickness of 1,500 Å. The amorphous silicon film was then heat-treated at a moderate temperature in the range of from 450° to 700° C. for a duration of from 12 to 70 hours in a non-oxidizing atmosphere. More specifically, for example, the film was maintained at 800° C. under a hydrogen or nitrogen atmosphere.

Since on the surface of the substrate was provided an amorphous silicon oxide layer under the silicon film, the whole structure could be uniformly annealed because there generated no nucleus present during the heat treatment. That is, the silicon film during deposition maintains an amorphous structure, and hydrogen is present only as a free atom.

Then, at the annealing step, the silicon film undergoes phase transition from the amorphous structure to a structure having a higher degree of ordering, and partly develops a crystalline portion. Particularly, the region which attained a relatively high degree of ordering at the film deposition of silicon tend to crystallize at this stage. However, the silicon bonding which combines the silicon atoms to each other attracts an atom in a region to another in another regions. This effect can be observed by a laser Raman spectroscopy as a peak which is shifted to a lower frequency side as compared with the peak at 522 $cm^{-1}$ for a single crystal silicon. The apparent grain size can be calculated by the half width as 50 to 500 Å, i.e., a size corresponding to that of a microcrystal, but, in fact, the film has a semi-amorphous structure comprising a plurality of those highly crystalline regions yielding a cluster structure, and the clusters are anchored to each other by the bonding between the silicon atoms (clustering). Thus was obtained a film having a semi-amorphous structure.

The semi-amorphous film thus obtained was subjected to a measurement of the elemental distribution along the direction of the depth, using, for example, a secondary ion mass spectroscopy (SIMS). The minimum concentration for the dopants (impurities) was found (either at the surface or at an inner portion apart from the surface) $3.4\times10^{19}$ $cm^{-3}$ for oxygen and $4\times10^{17}$ $cm^{-3}$ for nitrogen. Hydrogen was found at a concentration of $4\times10^{20}$ $cm^{-3}$ which accounts for 1% by atomic with respect to silicon which is present at a concentration of $4\times10^{22}$ $cm^{-3}$. The crystallization could be achieved, for example, by a thermal treatment at 600° C. for a duration of 48 hours in the case of a 1000 Å thick film containing oxygen at a concentration of $3.5\times10^{19}$ $cm^{-3}$. Upon increasing the oxygen concentration of the film to $3\times10^{20}$ $cm^{-3}$ and considering the film thickness, it was possible to crystallize a film as thick as in the thickness range of from 0.3 to 0.5 μm by annealing at 600° C. However, a film having the same oxygen concentration but reduced in thickness to 0.1 μm required a heat treatment at a higher temperature of 650° C. for the crystallization. In short, a thicker film and a lower impurity (e.g., oxygen) concentration favored the crystallization.

The semi-amorphous film thus obtained yields, as a result, a state in which substantially no grain boundary (referred to hereinafter as GB) exists. Since the carrier easily moves between the clusters through the anchored portions, a carrier mobility far higher than that of a polycrystalline silicon having a distinct GB can be realized. More specifically, a hole mobility, μh, in the range of from 10 to 200 cm$^2$/V·sec and an electron mobility, μe, in the range of from 15 to 200 cm$^2$/V·sec, are achieved.

On the other hand, if a high temperature annealing in the temperature range of from 900° to 1200° C. were to be applied in the place of a moderate temperature annealing as described hereinabove, impurities undergo a solid phase growth from the nuclei and segregate in the film. This results in the high concentration of oxygen, carbon, nitrogen, and other impurities at the GB which develops a barrier. Thus, despite the high mobility within a single crystal, the carrier is interfered at its transfer from a crystal to another by the barrier at the GB. In practice, it is quite difficult to attain a mobility higher than or equal to 10 cm$^2$/V·sec with a polycrystalline silicon at the present.

Thus, in the EXAMPLE according to the present invention, a semi-amorphous silicon semiconductor is utilized. Otherwise, a polycrystalline silicon semiconductor can be utilized, provided that a sufficiently high carrier mobility therein can be achieved therein.

Referring to FIG. 3(A), a process for fabricating an area 21 (having a channel width of 20 μm) for a P-TFT and an area 22 for an N-TFT at the right and left hand side, respectively, of FIG. 3(A) is described. The silicon film was masked with a first photomask ①, and subjected to photo-etching to obtain the areas.

On the resulting structure was deposited a silicon oxide film as a gate insulating film 27 to a thickness of from 500 to 2,000 Å, e.g., to a thickness of 1,000 Å. The conditions for the film deposition were the same as those employed in depositing the silicon oxide film to give a blocking layer. Further, a small amount of a halogen such as fluorine may be added during the film deposition to fix sodium ions.

Further on the gate insulating film was deposited an aluminum film at a thickness of 0.3 μm, which was subjected to patterning using a second photomask ②. Then, a gate 28 for the P-TFT and another gate 25 for the N-TFT were fabricated. The channel length was, for example, 10 μm.

Figure 3B:
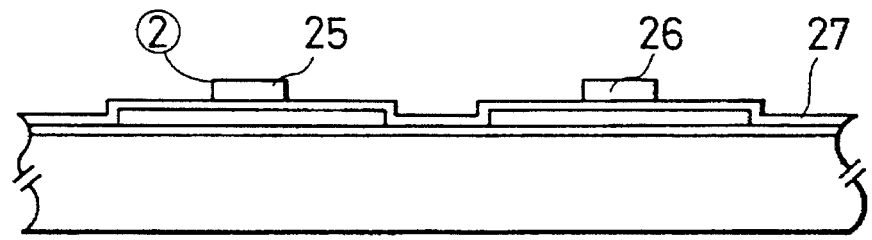
Figure 3C:
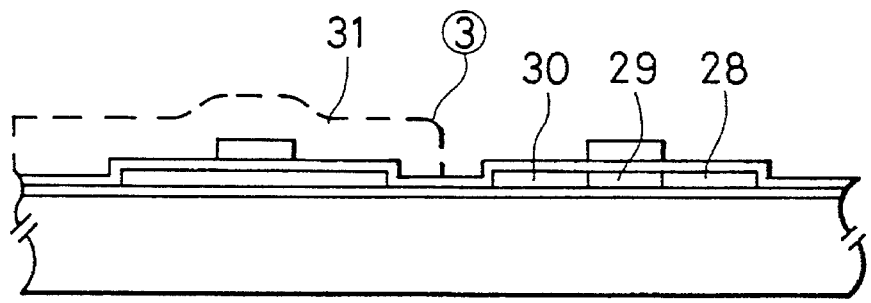

In FIG. 3(C), a photoresist 31 was formed using a photomask ③, and then boron was doped to a source 28 and a drain 30 for P-TFT at a dose of 1×10$^{15}$ cm$^{-2}$ by ion implantation Similarly, a photoresist 32 was formed using a photomask ④, and then phosphorus was doped to a source 35 and a drain 33 for N-TFT at a dose of 1×10$^{15}$ cm$^{-2}$ by ion implantation.

The doping was conducted through the gate insulating film 27. However, as is shown in FIG. 3(B), the silicon oxide on the silicon film may be removed using the gate electrodes 25 and as the masks, and then boron and phosphorus may be directly doped into the silicon film by ion implantation.

After removing the photoresist 32, the structure was reheated at 650° C. for a duration of 10 to 50 hours for annealing. Thus the impurities in the source 28 and the drain 30 of the P-TFT, as well as those in the source 35 and the drain 33 of the N-TFT were activated to give P$^+$ and N$^{+·}$ Furthermore, channel forming regions 34 and 29 were provided as a semi-amorphous semiconductor or a polycrystalline semiconductor under the gate electrodes 25 and 26.

Figure 3D:
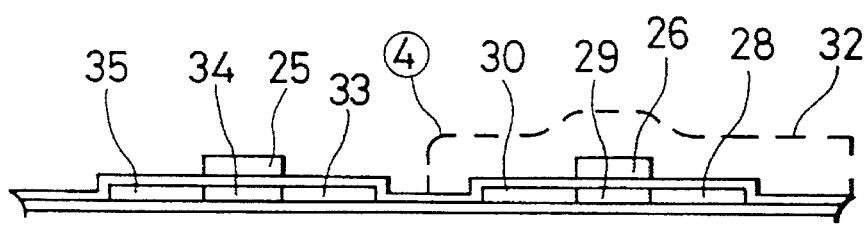

As described in the foregoing, a C/TFT can be fabricated in a self-aligned manner without heating it to a temperature of 700° C. or higher. This allows use of a non-expensive substrates and excluding use of the expensive quartz substrate and the like. The process is therefore suitable for manufacturing liquid crystal display devices having many pixels. The thermal annealing was conducted twice, as shown in FIGS. 3(A) and 3(D). However, the annealing corresponding to that of FIG. 3(A) may be omitted depending on the required device characteristics, and the thermal annealing may be integrated into one corresponding to that of FIG. 3(D) to speed up the process.

In the present EXAMPLE, aluminum was used for the gate. This was effective for reducing the interface state density of the gate insulating film and also the loss of carriers, because at the annealing step corresponding to FIG. 3(D), the aluminum functioned effectively for dissociating hydrogen molecules incorporated in the gate insulating film into hydrogen atoms.

Figure 3E:
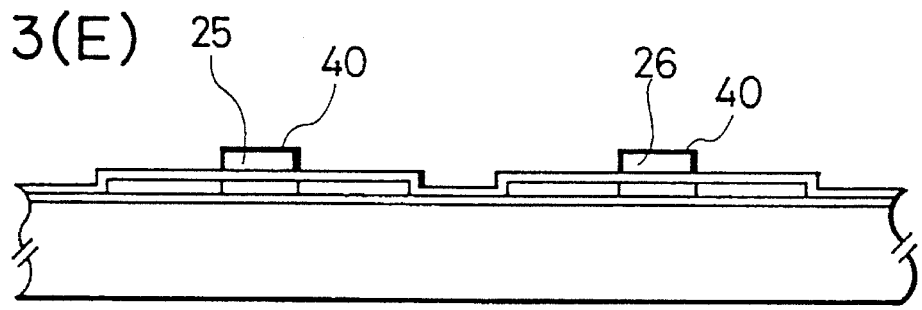

In the step corresponding to FIG. 3(E), the gate electrodes 25 and 26 were anodically oxidized to cover the surfaces thereof with aluminum oxide. More specifically, the substrate was dipped into a 13.7% sulfuric acid bath, and to the substrate was applied a current at a density of 1 mA/cm$^2$ using a carbon anode placed at a distance of 30 cm from the substrate. Thus was formed aluminum oxide film at a thickness of from 0.2 to 1 μm, for example, at a thickness of 0.5 μm.

The solution to be used in the anodic oxidation include, representatively, strong acid solutions of, such as sulfuric acid, nitric acid, and phosphoric acid, as well as mixed acid comprising tartaric acid or citric acid, having added therein ethylene glycol or propylene glycol or the like. A salt or an alkaline solution may be further added to the solution to thereby adjust the pH value of the solution.

The anodic oxidation was performed as follows. The substrate was immersed into an AGW electrolyte having prepared by adding 9 parts of propylene glycol to 1 part of an aqueous 3% tartaric acid solution. A direct current (D.C.) was applied to the substrate by connecting the aluminum gate electrode to the anode of a power source and using a carbon cathode as the counter electrode.

The electric current was applied first at a constant current density of 1 mA/cm$^2$ for 20 minutes, and then at a constant voltage for 5 minutes, to thereby obtain a 5,000 Å thick aluminum oxide film around the Mate electrode. The insulating properties of this aluminum oxide film was evaluated using a specimen having subjected to an oxidation treatment under the same condition as that employed above. As a result, a resistivity of 10$^9$ Ω·m and a dielectric breakdown of 2×10$^5$ V/cm was obtained for the film.

The surface of the sample was observed through a scanning electron microscope to find surface irregularities at a magnification of about 8,000, but free of minute holes. The film was therefore evaluated as a favorable insulator coating.

Figure 3F:
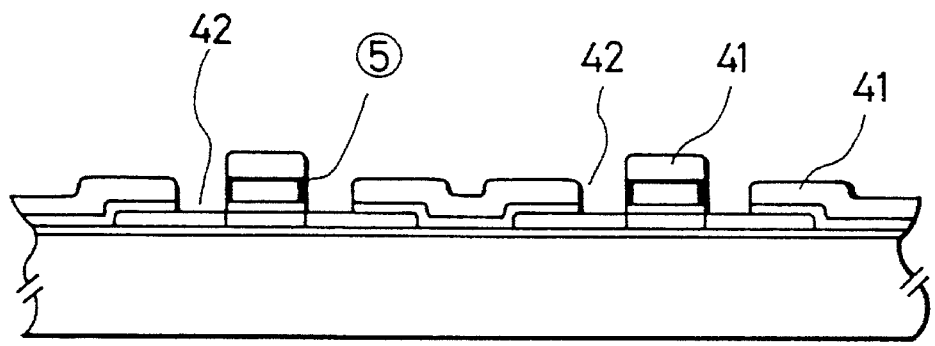

In the step corresponding to FIG. 3(F), the interlayer insulator 41 was formed by depositing a silicon oxide film by sputtering mentioned hereinbefore. Alternatively, the silicon oxide film may be deposited using an LPCVD or a photochemical vapor deposition method. The silicon oxide film thus obtained was 0.2 to 1.0 μm thick. Then, as is also shown in FIG. 3(F), a contact hole 42 was perforated in the film using a photomask ⑤. This fabrication process according to the present invention is characterized by that a reactive ion etching (RIE) process was employed to perforate the contact hole 42 at a position as near as possible to the channel, using gate electrodes 25 and 28 and the aluminum oxide film around them in a self-aligned manner, and thus minimizing the distance L between the channel and the feeding points for the source and the drain.

Then, aluminum was deposited over the whole structure by sputtering at a thickness of 0.5 to 1.0 μm, and leads 52 and 53 were formed using a photomask ⑥. These leads were used as contacts for the source regions 28 and 35 of the P-TFT and the N-TFT as shown in FIG. 3(G).

The surface of the resulting structure was coated with an organic resin 44, e.g., a transparent polyimide resin for smoothening, and subjected again to perforation of contact holes using a photomask ⑦.

Figure 3G:
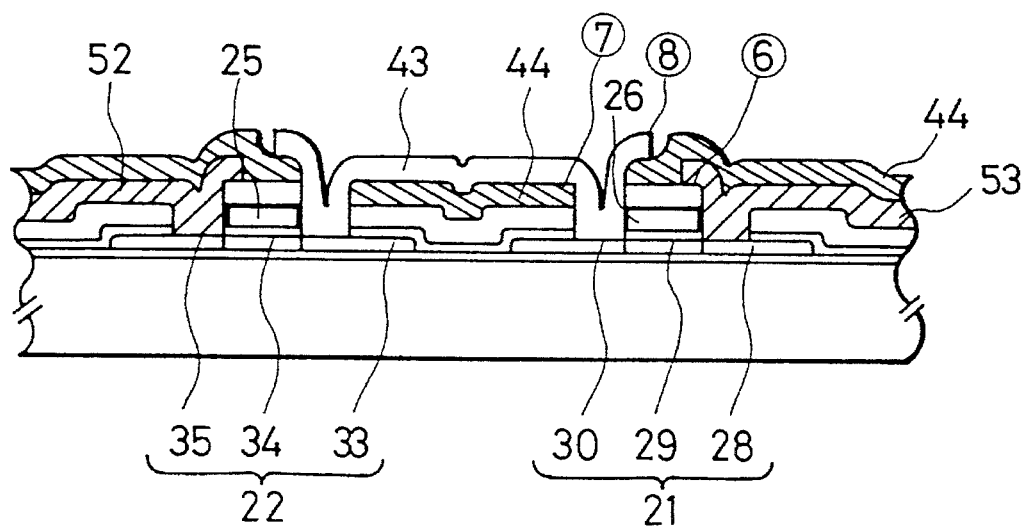

As is shown in FIG. 3(G), two TFTs were brought into a complementary arrangement, and an output terminal thereof was connected to a transparent electrode 43 provided to one side of a pixel of a liquid crystal device. The transparent electrode 4S was fabricated by etching an indium tin oxide (ITO) film having established by sputtering, using a photomask ⑧ at the etching. The ITO film was such having deposited in a temperature range of from room temperature to 150° C., followed by annealing at 200° to 400° C. in oxygen or in the atmosphere. Thus was fabricated a structure comprising the P-TFT 21, the N-TFT 22, and the transparent electrode 43 made of a conductive film on a single glass substrate 1.

The TFT thus obtained comprises a P-TFT having a mobility of 20 cm$^2$/Vsec with a $V_{th}$ of −5.9 V, and an N-TFT having a mobility of 40 cm$^2$/Vsec with a $V_{th}$ of +5.0 V.

It can be seen from the foregoing description that a mobility far higher than a value generally believed for a TFT has been achieved. This has enabled for the first time the production of an active matrix liquid crystal display device using a C/TFT pair for each of the pixels of the liquid crystal electro-optical device. Furthermore, the present invention has also enabled formation of the peripheral circuits on-glass, i.e., by fabricating the circuits on the same substrate employing a fabrication process similar to that applied to the fabrication of the TFTs.

In the EXAMPLE, the TFT according to the present invention was applied to a liquid crystal electro-optical device. Because of the excellent frequency characteristics of the TFTs, such liquid crystal electro-optical devices can easily display dynamic images, and are therefore suitable for applications such as projection TV sets, view finders of video movies, and hanging-type TV sets. Additional application field to be mentioned is the driving elements of one- and two-dimensional image sensors, in which the excellent frequency characteristic is taken full advantage of in the rapid reading that can fully respond to the G4 standard.

A cell for a liquid crystal electro-optical device can be fabricated by a process well known in the art, using a pair of glass substrates, one having fabricated in a manner described above and the other having established thereon counter electrodes composed of transparent electrodes provided in stripes. The glass cell is filled with a liquid crystal material. If a twisted nematic (TN) liquid crystal were to be used, the cell spacing should be controlled to be about 10 μm, and orientation control films formed by rubbing treatment should be provided on the both of the transparent conductive films.

If a ferroelectric liquid crystal (FLC) were to be used as the liquid crystal material instead, the operating voltage should be controlled to ±20 V, the cell spacing should be controlled to 1.5 to 3.5 μm, e.g., 2.3 μm, and the orientation control film should be formed only on the counter electrode by subjecting the film to rubbing treatment.

In the case a dispersion type liquid crystal or a polymer liquid crystal is used, an orientation control film can be omitted and the operation voltage should be controlled to ±10 to ±15 V and the cell spacing to 1 to 10 μm to increase the switching rate.

Since the polarizer sheet can be excluded particularly in the case a dispersion type liquid crystal is used, the cell can be used either as a reflection type or as a transmission type and have an increased quantity of light. Moreover, because the liquid crystal has no threshold, the use of the C/TFT according to the present invention having a distinct threshold voltage enables a device having a higher contrast and free of cross-talk (undesired interference between the neighboring pixels).

EXAMPLE 2

Figure 10:
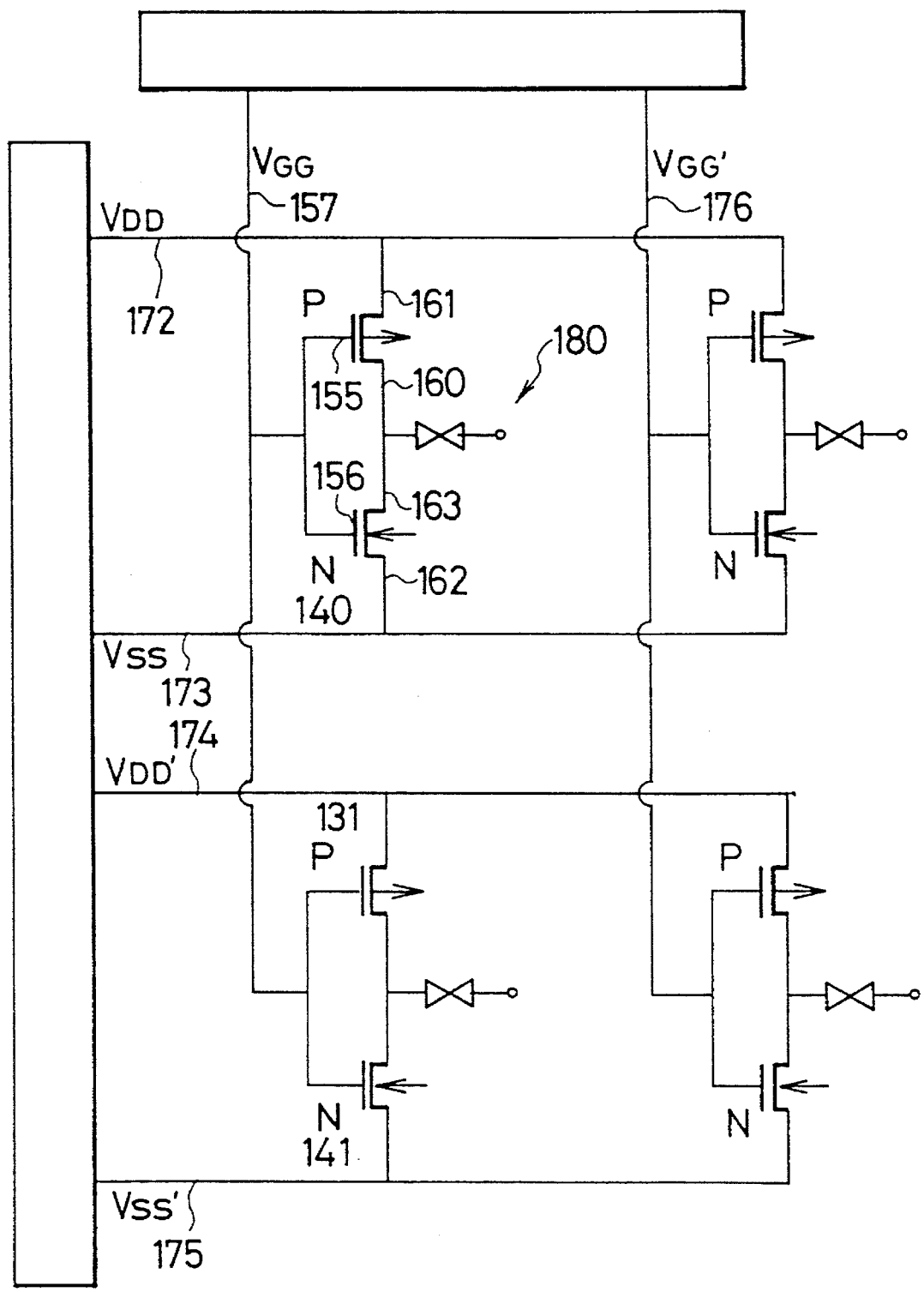
FIG. 10 shows a schematically drawn circuit diagram of a liquid crystal electro-optical device to which a complementary TFT according to an embodiment of the present invention is applied.

Referring to FIG. 10, an example of an active matrix type liquid crystal electro-optical device to which a TFT according to the present invention is applied is described. FIG. 10 shows the circuit diagram of the liquid crystal electro-optical device, and it can be seen therefrom that the active elements of the present EXAMPLE are provided in a complementary arrangement having a P-TFT and an N-TFT per one pixel contact.

Figure 12:
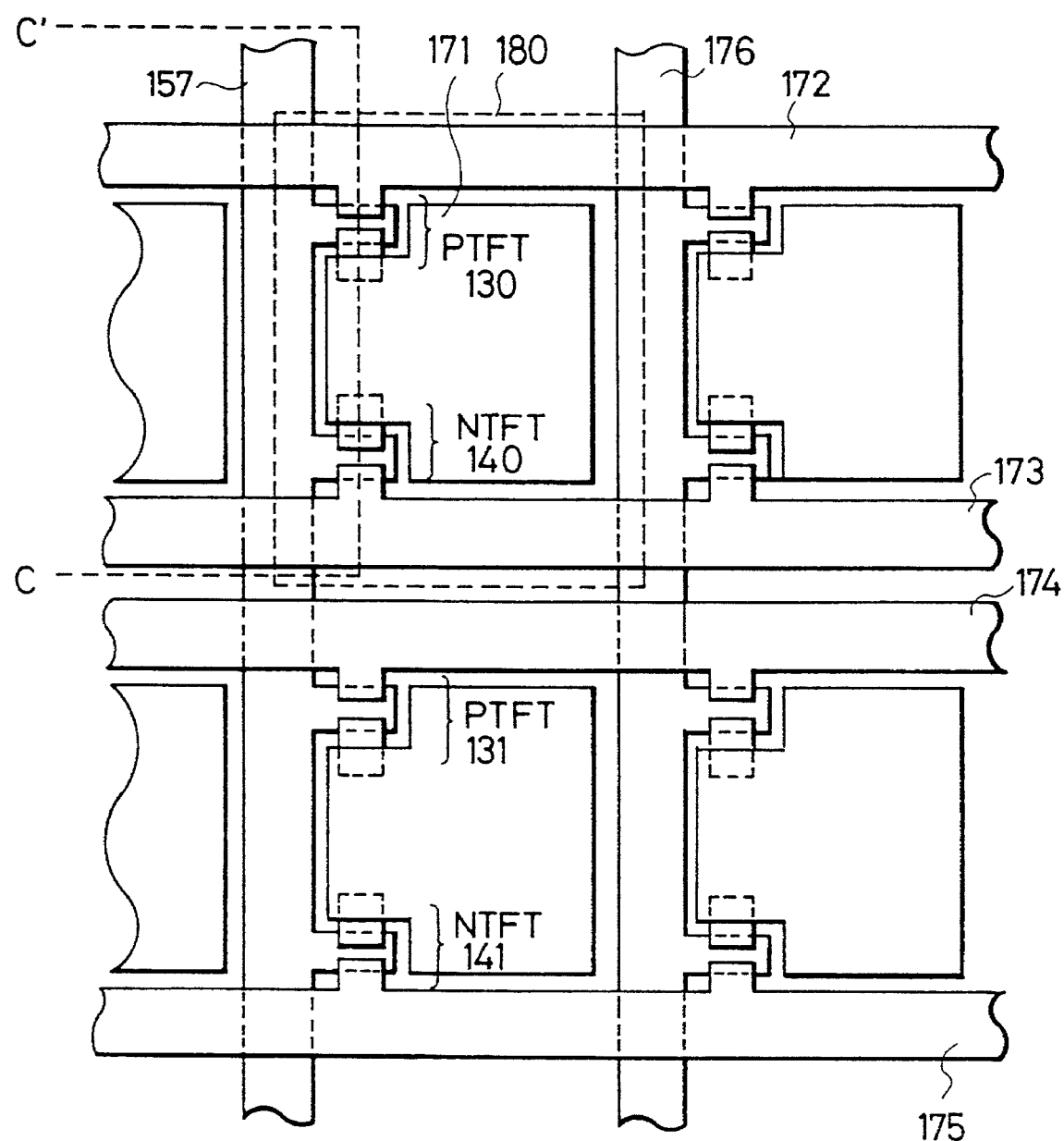
FIG. 12 shows a schematically drawn diagram indicating the mounted arrangement on the substrate of a liquid crystal electro-optical device to which a complementary TFT according to an embodiment of the present invention is applied.

The actual arrangement of the contacts and the like corresponding to the circuit shown in FIG. 10 is given in FIG. 12. For brevity's sake, merely a part of the circuit corresponding to a 2×2 matrix is given in FIG. 12.

Referring first to FIG. 11, the process for fabricating the substrate for use in the liquid crystal electro-optical device according to the present invention is described. FIG. 11(A) shows a step of depositing silicon oxide film as a blocking layer 151 at a thickness of from 1000 to 3000 Å, on a non-expensive glass substrate 150 using RF magnetron sputtering. In this case, the glass substrate is made of a non-expensive glass which resists to a heat treatment at 700° C. or lower, e.g., at about 800° C. The conditions for the fabrication are the same as those used in EXAMPLE 1. An amorphous silicon film was formed on the blocking layer at a thickness of 500 to 3000 Å, e.g. 1500 Å in the same way as in the EXAMPLE 1. Then, the amorphous silicon film was annealed in, for example, hydrogen atmosphere at 800° C. for a duration of 12 to 70 hours.

The amorphous silicon film turned into a phase having a higher structural ordering upon annealing, comprising partly a crystalline portion. The resulting film had a hole mobility, μh, of from 10 to 200 cm$^2$/V·sec, and an electron mobility, μe, of from 15 to 300 cm$^2$/V·sec.

Figure 11A:
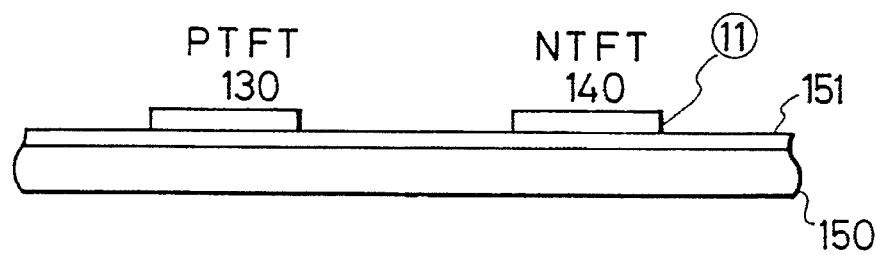
FIG. 11A–11I shows a schematically drawn cross-sectional view illustrating a fabrication process of a liquid crystal electro-optical device to which a complementary TFT according to an embodiment of the present invention is applied.

As is shown in FIG. 11(A), the silicon film was subjected to a photoetching treatment using a first photomask ⑪ to establish a P-TFT area 130 (having a channel length of 20 μm) and an N-TFT area 140, at the left and the right hand side, respectively, of FIG. 11(A).

On the resulting structure was deposited a silicon oxide film as a gate insulating film 153 to a thickness of from 500 to 2,000 Å, e.g., to a thickness of 700 Å. The conditions for the film deposition were the same as those employed in depositing the silicon oxide film 151 which gave a blocking layer. Further, a small amount of fluorine may be added during the film deposition to fix sodium ions. In this EXAMPLE, a silicon nitride film 154 was deposited on the gate insulating film as a blocking layer to avoid reaction of the gate insulating film and the gate electrode to be formed thereon. This silicon nitride film had a thickness of from 50 to 200 Å, more specifically, 100 Å.

Further on the structure thus obtained above was deposited an aluminum film as a gate electrode material at a thickness of from 3,000 Å to 1.5 μm, 1 μm for example, by a known sputtering process.

Other useful materials for the gate electrode include molybdenum (Mo), tungsten (W), titanium (Ti), tantalum (Ta), and alloys thereof with silicon, as well as laminate wires of silicon with other metal films.

The use of a metal as the gate electrode, particularly, aluminum or a like material having a low resistance as in the present EXAMPLE, avoids gate delay (delay in the pulsed voltage which is transferred through the gate wire and distortion of the waveform) which becomes more pronounced with increasing area and finer patterning of the substrate, and hence facilitates fabrication of devices with a large-area substrate.

Figure 11B:
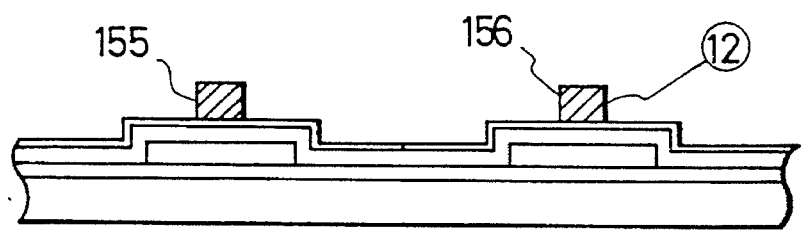
Figure 11C:
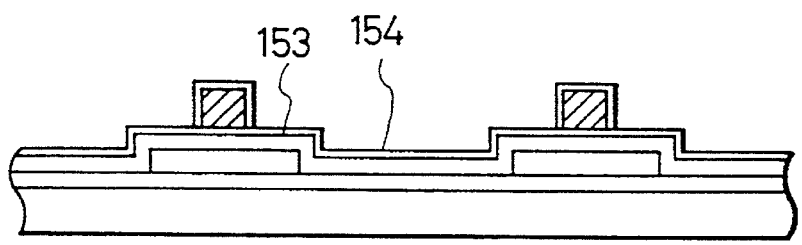

The aluminum film thus deposited was patterned through a second photomask ⑫ to obtain a structure as shown in FIG. 11(B), having a gate electrode 155 for the. P-TFT and a gate electrode 158 for the N-TFT. Both of the gate electrodes were connected to a common gate wire 157.

The substrate was immersed into an AGW electrolyte having prepared by adding 9 parts of propylene glycol to 1 part of an aqueous 3% tartaric acid solution. A direct current (D.C.) was applied to the substrate by connecting the aluminum gate to the anode of a power source and using a platinum cathode as the counter electrode. The gate electrodes were each connected to the respective gate wires, and a connection terminal was provided at the vicinity of the substrate end to clamp all the gate wires therewith for the connection. The anodic oxidation was conducted in this manner to form anodically oxidized films 158 and 159 around the gate electrodes as is shown in FIG. 11 (C).

In the anodic oxidation process, the electric current was applied first at a constant current density of 4 mA/cm$^2$ for 20 minutes, and then at a constant voltage for 15 minutes, to thereby obtain a 2,500 Å thick aluminum oxide film around the gate electrode. It is preferred to form the anodic oxide film as thick as possible, and this approach was taken in the present EXAMPLE as far as the process conditions permit.

Figure 11D:
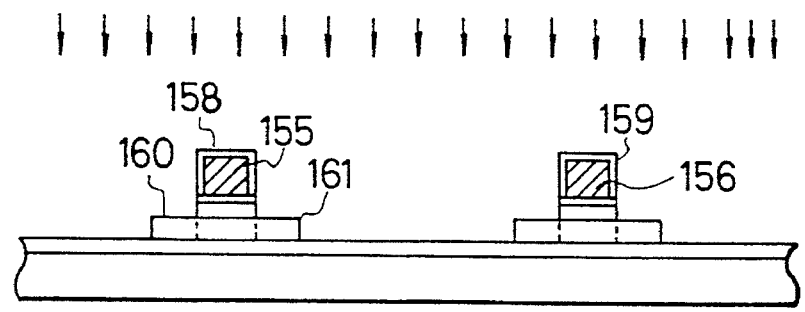

As is shown in FIG. 11(D), the nitride film 154 and the silicon oxide film 153 on the semiconductor was removed by etching. Then, boron was doped over the whole substrate as an impurity for P-TFT, at a dose of from $1\times10^{15}$ to $5\times10^{15}$cm$^{-2}$ by ion implantation. The concentration of the doping was controlled to about $10^{19}$ atoms·cm$^{-3}$ to establish a source 160 and a drain 161 for the P-TFT. In the present EXAMPLE, the ion doping was conducted after removing the insulator films on the surface. However, it is also possible to conduct the doping through the insulator films 153 and 154, by changing the conditions of ion implantation.

Figure 11E:
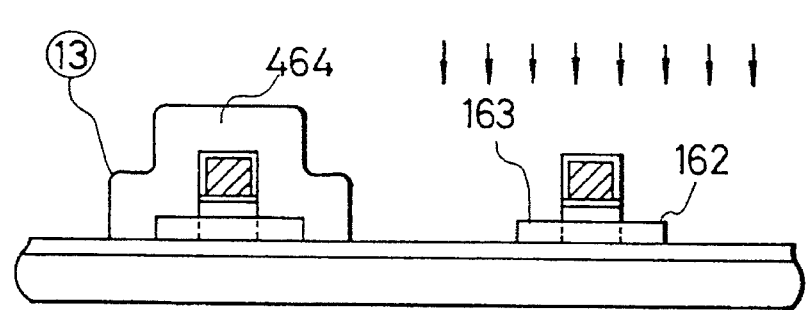
Figure 11F:
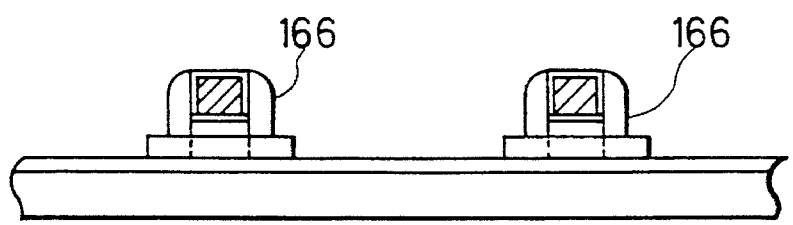

Similarly, as shown in FIG. 11(E), a photoresist 484 was formed using a third photomask ⑬ to cover the P-TFT area, and phosphorus was doped by ion implantation to establish a source 162 and a drain 163 for the N-TFT. The phosphorus was added at a dose of from $1\times10^{15}$ to $5\times10^{15}$cm$^{-2}$ so that the doping concentration became about $10^{20}$ atoms·cm$^{-3}$. In this case, an oblique doping was used, in which the ion was bombarded obliquely to the substrate in such a manner that the direction of the ion beam may make an acute angle with respect to the surface of the substrate. This process allows the impurity ions to intrude into a lower portion under the anodic oxide film around the gate. In this manner, the ends of the source and the drain areas were roughly adjusted to match the end of the gate electrode. Thus, the anodically oxidized film can function sufficiently as an insulator to the contact wiring to be formed in the later steps, and hence excludes a step of forming an insulator film.

The structure was then re-heated at 600° C. for a duration of 10 to 50 hours for annealing. Thus, the doped impurities in the source 160 and the drain 161 of the P-TFT, as well as those in the source 162 and the drain 163 of the N-TFT were activated to give P$^+$ and N$^+$. Under the gate electrodes 155 and 156 were formed channel forming regions 164 and 165. Instead of employing thermal annealing for the activation as in the present EXAMPLE, a laser beam may be irradiated to the source and the drain regions for the activation. In such a case, the activation can be performed in an instant and therefore the problem of thermal diffusion of the gate metal need not be considered. Accordingly, it is possible to omit the formation of silicon nitride film 154 which functions as a blocking layer on the gate insulating film.

A silicon oxide film as an insulator film was then deposited on the surface of the resulting structure by sputtering as mentioned above. The film is preferably as thick as possible, e.g., in a range of from 0.5 to 2.0 μm, 1.2 μm in this EXAMPLE. The film is then subjected to anisotropic etching from the upper side thereof to form a remainder area 188 at the vicinity of the side walls of a protrusion composed of the gate accompanied by the anodically oxidized film. The resulting structure is given in FIG. 11(F).

Then, the unnecessary portions were removed from the semiconductor film 152 by etching, using the protrusion above and the remainder area 188 as the mask. Then, the remainder area 188 around the protrusion was removed. Thus were obtained exposed semiconductor portions 152 at the outer side of the protrusion so that they may become a source and a drain region for each of the TFTs. The resulting structure is given in FIG. 11(G).

The whole structure was then covered with aluminum by sputtering, and after patterning the aluminum film through a fourth mask ⑭ to obtain leads 167 and 168 and contact portions 169 and 170, the unnecessary semiconductor film sticking out was removed by etching from the contacts 167, 168, 169, and 160; the gate electrodes 155 and 158; and the anodic oxide films 158 and 159 which accompany the gate electrodes. Thus were the elements separated from each other to complete a TFT. It can be seen from the foregoing description that a C/TFT pair was fabricated using merely four masks. The C/TFT pair thus obtained is shown in FIG. 11(H).

The TFT thus obtained comprises a gate electrode completely covered with an anodically oxidized film, and all the parts, exclusive of the source and the drain regions having contact connections sticking out from the gate portion, are established under the gate. The source and the drain electrodes are in contact with the source and the drain regions at two points, i.e., at the upper surface and the side face, to assure a sufficient ohmic contact.

Thus, as described in the foregoing, a C/TFT can be fabricated without heating the structure to a temperature 700° C. or higher through the whole process. Thus, an economically advantageous substrate can be used instead of an expensive one such as of quartz, and hence the process is best suited for producing liquid crystal electro-optical devices of many pixels.

The thermal annealing was conducted twice in the present EXAMPLE, as shown in FIGS. 11(A) and 11(E). However, the annealing corresponding to that of FIG. 11(A) may be omitted depending on the required device characteristics, and the thermal annealing may be integrated into one corresponding to that of FIG. 11(E) to speed up the process. Furthermore, the silicon nitride film 154 provided under the aluminum gate efficiently avoided reaction of the aluminum gate with the gate insulating film under the gate, and a favorable interfacial characteristic was realized.

Then, an ITO film was deposited by sputtering between two TFTs, so that the output contact thereof may be connected to a liquid crystal device, through one of the pixel electrodes provided as a transparent electrode in a complementary structure. The ITO film was deposited in the temperature range of from room temperature to 150° C., which was annealed at 200° to 400° C. in oxygen or in the atmosphere. The ITO film thus obtained was etched through a fifth photomask ⑤ to provide a pixel electrode 171. The resulting structure comprised a glass substrate having provided thereon a P-TFT 130, an N-TFT 140, and a transparent electrode 171 made from a transparent conductive film. The TFT thus obtained comprises a P-TFT having a mobility of 20 cm$^2$/Vsec with a $V_{th}$ of −5.9 V, and an N-TFT having a mobility of 40 cm$^2$/Vsec with a $V_{th}$ of +5.0 V.

In FIG. 12 is given the arrangement of the electrodes and the like of this liquid crystal electro-optical device. The cross sectional view along the line C—C' in FIG. 12 corresponds to those given in FIG. 11. The P-TFT 130 is provided to the crossing point of a first signal wire 172 and a third signal wire 157. Similarly, a P-TFT for another pixel is provided to the crossing point of the first signal wire 172 and another third signal wire 176 established as a right side neighbor of the wire 157. The N-TFT, on the other hand, is provided to the crossing point of a second signal wire 173 and the third signal wire 157. Furthermore, a P-TFT for another pixel is provided to the crossing point of another first signal wire 174 neighboring on the wire 172 and a third signal wire 157. Thus was obtained a matrix structure constructed from C/TFTs. The P-TFT 130 is connected to the first signal wire 172 through the contact of the drain 161, and the gate 155 is connected to the signal wire 157. The output terminal of the source 160 is connected to the pixel electrode 171 through a contact.

Similarly, the N-TFT 140 is connected to the second signal wire 173 through the contact of the source 162, to the signal wire 157 through the gate 158, and to the same pixel electrode 171 as in the case of P-TFT, by the output terminal of the drain 163 through a contact. Another C/TFT, which is provided next to the one described above and connected to the same third signal wire above, comprises a P-TFT 131 connected to the first signal wire 174 and an N-TFT 141 connected to a second signal wire 175. In this manner a pixel 180 is constructed inside a pair of signal wires 172 and 173, comprising a pixel electrode 171 composed of a transparent conductive film and a C/TFT pair. By repeating this structure along the vertical and horizontal directions, a 2×2 matrix can be extended into liquid crystal electro-optical devices having many pixels, such as those composed of 640×480 pixels and 1280×960 pixels. In the foregoing description, the impurity doped regions of the TFTs are referred to as source-and drain for making the explanation simple. In the actual drive of the TFTs, the functions of those regions may differ in some cases.

In the TFT of the present EXAMPLE, the elements in each of the TFTs are separated into islands by removing the semiconductor film 152 through an etching process using a first photomask. Accordingly, the gate wiring outside the TFT areas is free of the underlying semiconductor film, and is established on the substrate or an insulator film having formed on the substrate. This structure avoids formation of a capacitance at the gate input side, and allows a high speed response.

A liquid crystal electro-optical device was then fabricated using the thus obtained substrate having established thereon the active elements. The substrate was first screen-coated with a UV-curable epoxy-modified acrylic resin having dispersed therein 50% by weight of a nematic liquid crystal. In the process, a 125 mesh/inch screen was used for the coating, and a squeegee pressure of 1.5 kg/cm$^2$ was applied. The resulting emulsion thickness was 15 μm. After leveling for 10 minutes, the resin emulsion layer was cured with a high pressure mercury vapor lamp emitting a light having the main peak at a wavelength of 236 nm at an energy of 1,000 mJ. Thus was obtained a 12 μm thick light influencing layer.

A second electrode was then established on the cured resin layer by depositing thereon a 2,500 Å thick molybdenum (Mo) film by D.C. sputtering.

A black-colored epoxy resin was then applied to the surface by screen-printing, which was pre-baked at 50° C. for 30 minutes and then baked at 180° C. for 30 minutes to establish a 50 μm thick protective film.

A reflection-type liquid crystal display device was completed by connecting a TAB-shaped driver IC to the lead on the substrate. This device was comprises only one substrate.

In the EXAMPLE described above, a pair of TFTs in a complementary arrangement was provided as an active element to each of the pixels. However, the liquid crystal electro-optical devices are not limited to this structure, and plural pairs of TFTs in a complementary arrangement may be provided to each of the pixels. Otherwise, plural pairs of TFTs in a complementary arrangement may be provided to pixel contacts divided into plural contacts.

A liquid crystal electro-optical device comprising a dispersion type liquid crystal equipped with active elements was completed in this manner. Since the dispersion-type liquid crystal of the present EXAMPLE can be constructed on only one substrate, a light-weight and thin liquid crystal electro-optical device can be realized economically. More advantageously, a liquid crystal electro-optical device of high illuminance was obtained, because the device is constructed from a single substrate free of polarizer sheets and orientation control films.

EXAMPLE 3

Figure 13:
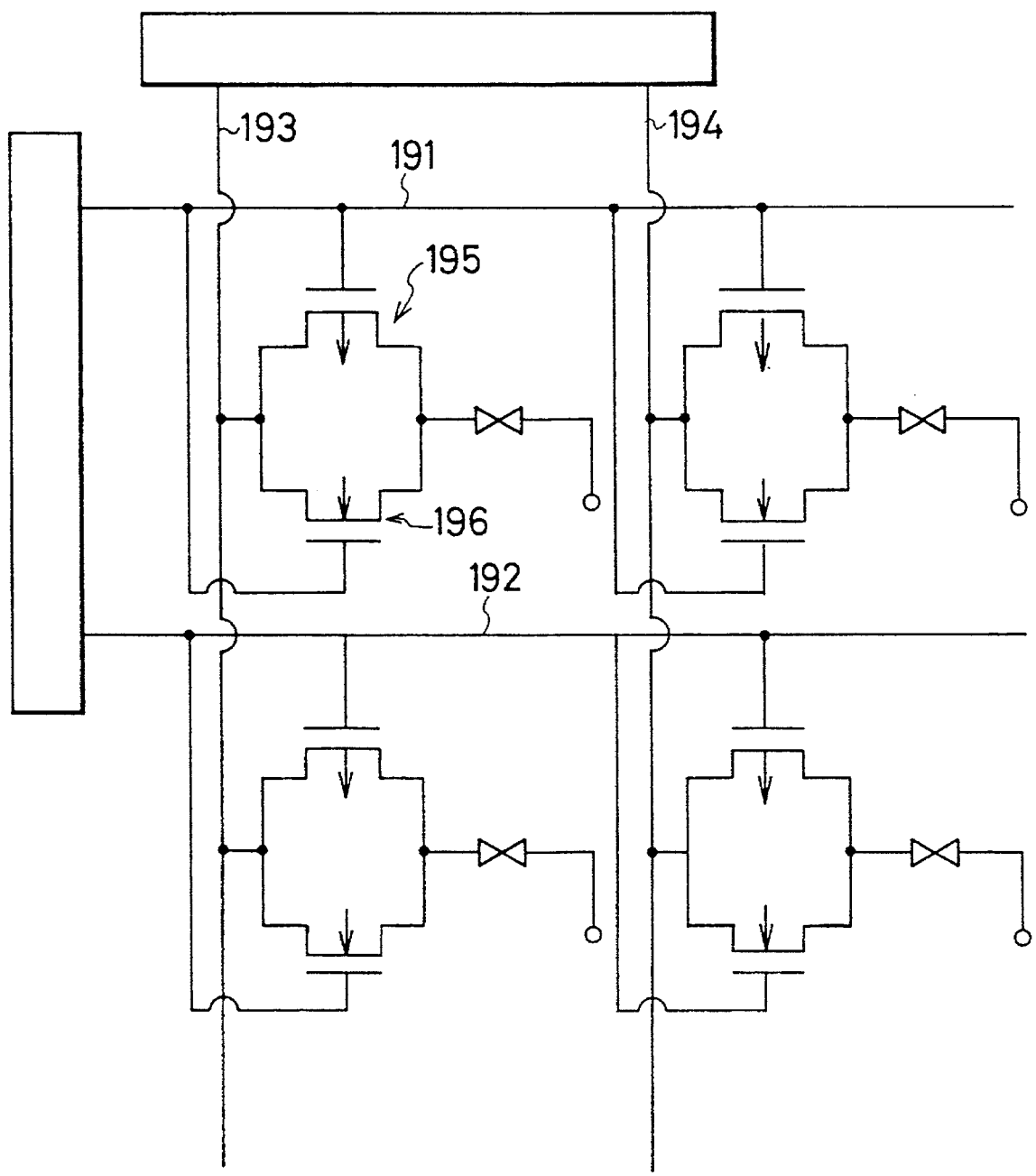
FIG. 13 shows a schematically drawn circuit diagram of a liquid crystal electro-optical device to which a complementary TFT according to another embodiment of the present invention is applied.

Referring to FIG. 13, an example of a liquid crystal electro-optical device comprising pixels having provided to each thereof modified transfer-gate TFTs in a complementary arrangement is described. The TFTs in this EXAMPLE are fabricated basically in the same process as those in EXAMPLE 2, and the process steps proceed in a similar manner as shown in FIG. 11. The only difference is the arrangement of the C/TFT shown in FIG. 11, because the one used in the present EXAMPLE is a modified transfer-gate C/TFT. The actual arrangement and connection of the C/TFT of the present EXAMPLE is given in FIG. 14.

As shown in FIG. 13, a common gate wire 191 is connected with gates of a P-TFT 195 and a N-TFT 196. These TFTs are connected to another signal wire 193 through source and drain areas, and the other source and drain areas are connected to a common pixel electrode.

Figure 11G:
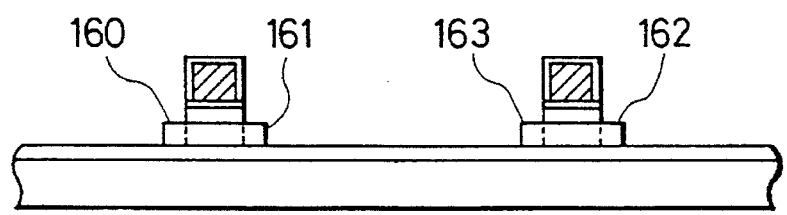
Figure 11H:
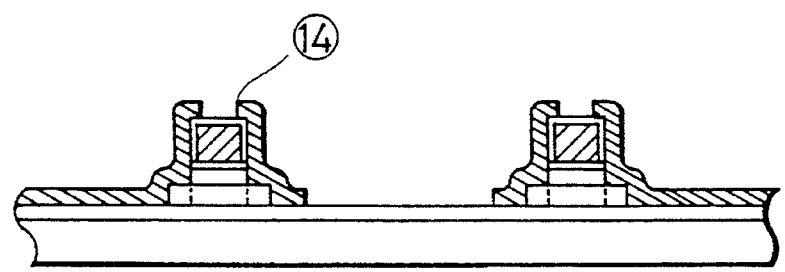

The fabrication process proceeds the same to FIG. 11(G). The structure obtained to the step shown in FIG. 11(G) is coated with a silicon nitride film 200 at a thickness of from 500 to 2,000 Å. The resulting silicon nitride film 200 is anisotropically etched along the direction vertical to the substrate to remain the silicon nitride film on the side wall of the anodically oxidized film 201 provided on the gate electrode. The silicon nitride film need not be left out uniformly, provided that the film remains at least on the gate 207 and on the gate insulating film at the proximity of the semiconductor. This silicon nitride film functions as a protective layer to avoid short circuit at the vicinity of the end portion of a gate insulating film 203, caused by a metallic wiring 202, a source area 204, and a drain area 205, upon formation of source and drain 202 at the later steps.

On the surface of the resulting structure is then deposited an interlayer insulator film and a silicon oxide film 206 at a thickness of from 1,000 Å to 2 μm, e.g., 6,000 Å in this case. After forming a photoresist thereon, a mask is formed on the gate 207 using the gate as the mask by exposure to light from the substrate side. Then an interlayer insulator film 208 can be obtained on the gate by etching.

Figure 11I:
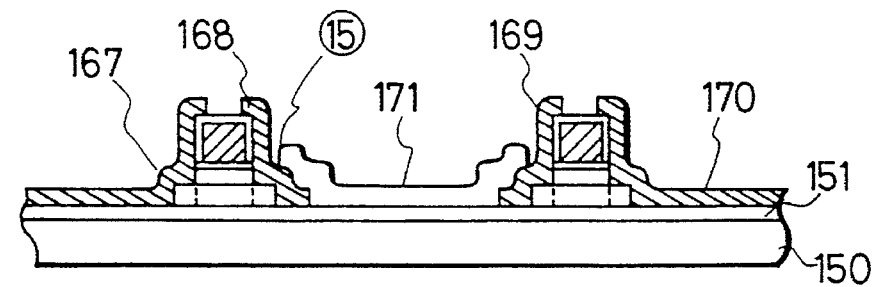

The process is then forwarded in the same manner as in FIGS. 11(H) and 11(I), to thereby complete the structure into a modified transfer-gate TFT having an arrangement and structure as shown in FIGS. 14(A), 14(B), and 14(C). In FIGS. 14(B) and 14(C) are shown clearly that the gate 207 always comprises thereon an interlayer insulator film 206, by which an effective interlayer insulating function is provided to the crossings of the lead portion of the gate wiring 207 with the lead portion of the source and drain wiring 202. Thus, as is shown in FIG. 14(A), the formation of unfavorable wiring capacitance could be avoided.

As was described above, an active element substrate was obtained with the same number of masks as that in EXAMPLE 2, yet having reduced in capacitance around the wiring and composed of TFTs having such a structure less apt to cause short circuit at the vicinity of the gate insulating film.

An active matrix super-twisted nematic (STN) liquid crystal electro-optical device was then produced, by combining and adhering the substrate obtained above as a first substrate with a second substrate having subjected to orientation treatment and having provided thereon a counter electrode, and injecting an STN liquid crystal therebetween according to a known technology.

In the foregoing EXAMPLES, the TFTs according to the present invention were applied to liquid crystal electro-optical devices. However, the EXAMPLES above are not limiting, and the TFTs can be readily applied to other devices and three-dimensional IC elements and the like.

The present invention enables fabrication of TFT elements using considerably reduced number of masks. Accordingly, semiconductor devices can be produced through a far simpler fabrication process and with increased production yield by applying the TFTs of this structure to the fabrication of the devices. Thus, the present invention provides semiconductor devices at a reduced production cost.

The TFT according to the present invention comprises a metallic gate electrode having subjected to anodic oxidation to form an oxide film on the surface thereof, so that a wiring comprising a three-dimensional crossing can be established thereon. Furthermore, the feeding points of the source and the drain are provided very near to the channel by the use of said gate with an oxide film around it, and by exposing only the contact portions of the source and the drain out of the gate. Thus were avoided the drop of frequency characteristics of the device and the increase of ON resistivity.

Furthermore, in an embodiment according to the present invention in which an aluminum gate is used, hydrogen having incorporated into the gate oxide film could be reduced during the annealing step by dissociating $H_2$ into H taking advantage of the catalytic effect of aluminum. Thus, the interfacial density of states ($Q_{SS}$) could be lowered as compared to the case in which a silicon gate is used, and, by this effect, an element having improved characteristics was realized.

The source and the drain of the TFTs according to the present invention were established in a self-aligned manner. The same was done in the positioning of contact portions of the source and the drain. Thus, the area necessary to accommodate the elements to construct a TFT was reduced, and hence was effective for achieving a higher degree of integration. In the case the TFTs were used as active elements for a liquid crystal electro-optical device, the aperture ratio of the liquid crystal panel was increased.

The anodically oxidized film around the gate was taken full advantage of, and a TFT having a distinguished structure was proposed. This TFT, moreover, can be fabricated with minimized number of masks, the minimum being 2 masks.

In a C/TFT according to the present invention, a semiamorphous or semi-crystalline semiconductor was used. However, the semiconductor may be replaced by semiconductors differing in crystal structure if possible, provided that they are used for the same purpose. By the use of a self-aligned C/TFT, a rapid processing was possible. However, this is not limiting, and TFTs may be fabricated by a non-self-aligned manner without using ion implantation. Furthermore, it should be noted that the present invention is not limited only to stagger-type TFTs, but also encompasses inverted-type stagger TFTs and other types of TFTs.

While the invention has been described in detail and with reference to specific embodiments thereof, it will be apparent to one skilled in the art that various changes and modifications can be made therein without departing from the spirit and scope thereof.

What is claimed is:

1. A method for forming a semiconductor device comprising the steps of:

forming a semiconductor film on an insulating surface;

forming a gate electrode comprising a metal on said semiconductor film with a gate insulating layer therebetween;

oxidizing said metal of a peripheral portion of said gate electrode to form an oxide of said metal at least on a side surface of said gate electrode, said oxide having outer edges; and adding impurity ions into portions of said semiconductor film with said gate electrode and said oxide as a mask in order to form a pair of impurity regions with opposing inner edges in said semiconductor film, wherein said inner edges of said semiconductor film are determined by said outer edges.

2. The method of claim 1 further comprising the steps of:

forming an insulating film on said insulating surface over said gate electrode; and forming at least one contact hole corresponding to one of a source and drain semiconductor region in said insulating film with a side surface of said contact hole located adjacent to said oxide formed on a side surface of said gate electrode.

3. The method of claim 2 wherein said contact hole forming step is carried out with said gate electrode and said oxide as a mask.

4. The method of claim 2 wherein said contact hole forming step is carried out to leave the insulating film on an upper surface of said gate electrode by the use of a photomask.

5. The method of claim 4 wherein the insulating film remains on said upper surface of said gate electrode with said oxide extending between said insulating film and said gate electrode by said contact hole forming step.

6. The method of claim 1 wherein said semiconductor film forming step is carried out by forming a silicon semiconductor film containing hydrogen therein on said insulating surface and subsequently crystallizing said silicon semiconductor film by thermal treatment.

7. The method of claim 1 wherein said impurity ions are directed toward said semiconductor in a vertical direction with respect to said insulating surface.

8. The method of claim 1 wherein said impurity ions are directed toward said semiconductor in an oblique direction with respect to said insulating surface.

9. A method for forming a semiconductor device comprising the steps of:

forming a semiconductor film on an insulating surface;

forming a gate insulating layer on said semiconductor film;

forming a gate electrode comprising a metal on said gate insulating layer;

oxidizing said metal of a peripheral portion of said gate electrode by anodic oxidation to form an oxide of said metal at least in the vicinity of said semiconductor film;

forming an insulating film on said gate insulating layer over said gate electrode;

selectively removing the insulating film and the gate insulating layer by anisotropic etching to leave a portion of the insulating film and the gate insulating layer around a side of said gate electrode;

selectively removing the semiconductor film by etching with said gate electrode and said oxide and the remaining portion of the insulating film as a mask;

exposing a portion of the semiconductor film provided under the remaining portion of the insulating film and a portion of the gate insulating layer provided under the remaining portion of the insulating film by etching;

forming a conductive film on said substrate over said oxide and the exposed portion of the semiconductor film; and patterning said conductive film with a mask to form source and drain electrodes which extend on said oxide and are in contact with upper and side surfaces of the exposed portion of the semiconductor film.

10. The method of claim 9 further comprising the step of implanting impurities into the exposed portion of the semiconductor film to form source and drain regions therein.

11. The method of claim 9 further comprising the step of implanting impurities into the semiconductor film with said oxide as a mask before said insulating film forming step.

12. A method for forming a semiconductor device comprising the steps of:

forming a semiconductor island on an insulating surface;

forming a gate insulating layer on said semiconductor island;

forming a gate electrode comprising a metal on said gate insulating layer;

oxidizing said metal of a peripheral portion of said gate electrode by anodic oxidation to form an oxide of said metal at least in the vicinity of said semiconductor island said oxide having outer edges; and adding impurity ions into portions of said semiconductor film with said gate electrode and said oxide as a mask in order to form a pair of impurity regions with opposing inner edges in said semiconductor film, wherein said inner edges of said semiconductor film are determined by said outer edges.

13. The method of claim 12 further comprising the steps of:

selectively removing the gate insulating layer with said gate electrode and said oxide as a mask;

forming an insulating film on said insulating surface over said oxide;

selectively removing the insulating film by anisotropic etching to leave a portion of the insulating film around a side of said gate electrode;

selectively removing the semiconductor island by etching with said gate electrode and said oxide and the remaining portion of the insulating film as a mask;

removing the remaining portion of the insulating film by etching to expose a portion of the semiconductor island provided under the remaining portion of the insulating film;

forming a conductive film on said insulating surface over the exposed portion of the semiconductor island; and patterning said conductive film with a mask to form source and drain electrodes which extend on said oxide and are in contact with the exposed portion of the semiconductor island.

14. The method of claim 12 wherein said impurity ions are directed toward said semiconductor in a vertical direction with respect to said insulating surface.

15. The method of claim 12 wherein said impurity ions are directed toward said semiconductor in an oblique direction with respect to said insulating surface.

* * * * *